US012426232B2

(12) United States Patent
Jang et al.

(10) Patent No.: US 12,426,232 B2
(45) Date of Patent: Sep. 23, 2025

(54) SEMICONDUCTOR STRUCTURE WITH SEMICONDUCTOR PILLARS AND METHOD FOR MANUFACTURING SAME

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Minki Hong, Hefei (CN); Kyongtaek Lee, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 476 days.

(21) Appl. No.: 17/934,551

(22) Filed: Sep. 22, 2022

(65) Prior Publication Data

US 2023/0016938 A1 Jan. 19, 2023

Related U.S. Application Data

(63) Continuation of application No. PCT/CN2022/101523, filed on Jun. 27, 2022.

(30) Foreign Application Priority Data

Jun. 8, 2022 (CN) ......................... 202210644584.0

(51) Int. Cl.
*H10D 84/01* (2025.01)
*H10B 12/00* (2023.01)
(Continued)

(52) U.S. Cl.
CPC ............. *H10B 12/00* (2023.02); *H10B 12/01* (2023.02); *H10B 12/0335* (2023.02);
(Continued)

(58) Field of Classification Search
None
See application file for complete search history.

(56) References Cited

U.S. PATENT DOCUMENTS 5,244,824 A 9/1993 Sivan
5,994,735 A * 11/1999 Maeda .................. H10D 84/85 257/302

(Continued)

FOREIGN PATENT DOCUMENTS

CN 101017825 A 8/2007
CN 101740500 A 6/2010

(Continued)

OTHER PUBLICATIONS

Translation of Ding, CN-114203706-A (Year: 2022).*

*Primary Examiner* — Kretelia Graham
*Assistant Examiner* — William Henry Anderson
(74) *Attorney, Agent, or Firm* — SYNCODA LLC; Feng Ma

(57) ABSTRACT

A semiconductor structure includes: a substrate, a first gate structure, and a second gate structure. The substrate includes: discrete first semiconductor pillars arranged at a top of the substrate and extending in a vertical direction; and a second semiconductor pillar and a third semiconductor pillar extending in the vertical direction, the second and third semiconductor pillars are provided at a top of each first semiconductor pillar. The first gate structure is arranged in a middle region of the first semiconductor pillar and surrounds the first semiconductor pillar. The second gate structure is arranged in a middle region of the second semiconductor pillar and of the third semiconductor pillar, and includes a first ring structure and a second ring structure. The first ring structure surrounds the second semiconductor pillar, and the second ring structure surrounds the third semiconductor pillar.

19 Claims, 25 Drawing Sheets

Semiconductor structure 80

Z Y X 02 03 20 201 202 41 304 302 30 303 301 01 51 04 00 10

(51) Int. Cl.

| | |
|---|---|
| ***H10D 30/01*** | (2025.01) |
| ***H10D 30/67*** | (2025.01) |
| ***H10D 62/10*** | (2025.01) |
| ***H10D 64/23*** | (2025.01) |
| ***H10D 64/27*** | (2025.01) |

(52) U.S. Cl.

CPC ..... *H10B 12/0383* (2023.02); *H10B 12/0387* (2023.02); *H10B 12/053* (2023.02); *H10B 12/315* (2023.02); *H10B 12/395* (2023.02); *H10B 12/488* (2023.02); *H10D 30/025* (2025.01); *H10D 30/6733* (2025.01); *H10D 30/6735* (2025.01); *H10D 62/122* (2025.01); *H10D 64/252* (2025.01); *H10D 64/512* (2025.01); *H10D 64/513* (2025.01); *H10D 64/517* (2025.01); *H10D 64/518* (2025.01); *H10D 64/519* (2025.01); *H10B 12/05* (2023.02); *H10D 30/6757* (2025.01); *H10D 84/0172* (2025.01); *H10D 84/0179* (2025.01)

(56) References Cited

U.S. PATENT DOCUMENTS

| | | | | |
|---|---|---|---|---|
| 6,376,303 | B1 | 4/2002 | Seo | |
| 9,673,257 | B1 | 6/2017 | Takaki | |
| 11,177,389 | B2 * | 11/2021 | Rigano | H10D 30/6728 |
| 2006/0043471 | A1 | 3/2006 | Tang | |
| 2006/0046391 | A1 | 3/2006 | Tang | |
| 2007/0020819 | A1 | 1/2007 | Tang | |
| 2007/0048943 | A1 | 3/2007 | Tang | |
| 2007/0181925 | A1 | 8/2007 | Yoon | |
| 2007/0224753 | A1 | 9/2007 | Tang | |
| 2009/0072291 | A1 | 3/2009 | Takaishi | |
| 2009/0207649 | A1 | 8/2009 | Tang | |
| 2010/0120221 | A1 | 5/2010 | Kang | |
| 2010/0213525 | A1 | 8/2010 | Masuoka | |
| 2011/0104862 | A1 | 5/2011 | Kadoya | |
| 2011/0171796 | A1 | 7/2011 | Tang | |
| 2013/0011987 | A1 | 1/2013 | Park | |
| 2013/0056698 | A1 | 3/2013 | Satoh | |
| 2013/0075813 | A1 | 3/2013 | Kadoya | |
| 2015/0017767 | A1 | 1/2015 | Masuoka et al. | |
| 2015/0380548 | A1 | 12/2015 | Wang et al. | |
| 2016/0204251 | A1 | 7/2016 | Masuoka et al. | |
| 2017/0271510 | A1 | 9/2017 | Wang et al. | |
| 2017/0309632 | A1 | 10/2017 | Masuoka et al. | |
| 2017/0323977 | A1 | 11/2017 | Cheng et al. | |
| 2018/0061837 | A1 * | 3/2018 | Mathew | H10B 12/00 |
| 2018/0083136 | A1 | 3/2018 | Xie et al. | |
| 2018/0096896 | A1 | 4/2018 | Zhu | |
| 2018/0175212 | A1 | 6/2018 | Cheng et al. | |
| 2019/0027570 | A1 | 1/2019 | Ching et al. | |
| 2019/0115438 | A1 | 4/2019 | Ching et al. | |
| 2019/0123053 | A1 | 4/2019 | Masuoka et al. | |
| 2019/0237581 | A1 | 8/2019 | Saito et al. | |
| 2019/0326297 | A1 * | 10/2019 | Ujihara | H10B 12/50 |
| 2019/0326395 | A1 | 10/2019 | Ando et al. | |
| 2020/0020812 | A1 | 1/2020 | Masuoka et al. | |
| 2020/0052084 | A1 | 2/2020 | Ching et al. | |
| 2021/0305431 | A1 | 9/2021 | Ishimaru et al. | |
| 2022/0069070 | A1 | 3/2022 | Lai et al. | |
| 2022/0102347 | A1 | 3/2022 | Lai et al. | |
| 2022/0139918 | A1 | 5/2022 | Lee | |
| 2022/0139920 | A1 | 5/2022 | Lee | |
| 2022/0199837 | A1 | 6/2022 | Masuoka et al. | |
| 2022/0262954 | A1 | 8/2022 | Ishimaru et al. | |
| 2023/0157033 | A1 * | 5/2023 | Wang | H01L 23/5283 257/421 |

FOREIGN PATENT DOCUMENTS

| | | | | |
|---|---|---|---|---|
| CN | 101933135 | A | 12/2010 | |
| CN | 102867752 | A | 1/2013 | |
| CN | 105280698 | A | 1/2016 | |
| CN | 106252352 | A | 12/2016 | |
| CN | 107845578 | A | 3/2018 | |
| CN | 110476230 | A | 11/2019 | |
| CN | 110931429 | A | 3/2020 | |
| CN | 113078155 | A | 7/2021 | |
| CN | 113078156 | A | 7/2021 | |
| CN | 113451405 | A | 9/2021 | |
| CN | 114203706 | A * | 3/2022 | H10B 10/18 |
| CN | 114464535 | A | 5/2022 | |
| CN | 114497039 | A | 5/2022 | |
| EP | 1804286 | A1 | 7/2007 | |
| WO | 2013033267 | A1 | 3/2013 | |

* cited by examiner

SEMICONDUCTOR STRUCTURE WITH SEMICONDUCTOR PILLARS AND METHOD FOR MANUFACTURING SAME

CROSS-REFERENCE TO RELATED APPLICATION

This is a continuation of International Patent Application No. PCT/CN2022/101523 filed on Jun. 27, 2022, which claims priority to Chinese Patent Application No. 202210644584.0 filed on Jun. 8, 2022. The disclosures of the above-referenced applications are hereby incorporated by reference in their entirety.

BACKGROUND

As the integration density of a dynamic memory develops to be higher, the arrangement mode of transistors in a dynamic memory array structure and how to reduce the size of a single functional device in the dynamic memory array structure are researched, and the electrical performance of the small-size functional device needs to be improved.

Higher density efficiency may be achieved when a Vertical Gate All Around (VGAA) transistor structure is used as an access transistor of the dynamic memory. However, in some implementations, the performance of a semiconductor structure related to the access transistor is low.

SUMMARY

The present disclosure relates, but is not limited, to a semiconductor structure and a method for manufacturing the same.

According to a first aspect of the present disclosure, there is provided a semiconductor structure, which includes: a substrate, a first gate structure, and a second gate structure.

The substrate includes discrete first semiconductor pillars arranged at a top of the substrate and extending in a vertical direction. The substrate further includes second semiconductor pillars and third semiconductor pillars extending in the vertical direction. The second semiconductor pillar and the third semiconductor pillar are provided a top of each of the first semiconductor pillars.

The first gate structure is arranged in a middle region of the first semiconductor pillar and surrounds the first semiconductor pillar.

The second gate structure is arranged in a middle region of the second semiconductor pillar and of the third semiconductor pillar, and includes a first ring structure and a second ring structure. The first ring structure surrounds the second semiconductor pillar, and the second ring structure surrounds the third semiconductor pillar.

According to a second aspect of the present disclosure, there is provided a method for manufacturing a semiconductor structure, which may include the following operations. A substrate including discrete first semiconductor pillars arranged at a top of the substrate and extending in a vertical direction, and second semiconductor pillars and third semiconductor pillars extending in the vertical direction, is provided, where the second semiconductor pillar and the third semiconductor pillar are arranged symmetrically at a top of each of the first semiconductor pillars. A first gate structure surrounding the first semiconductor pillar is formed in a middle region of the first semiconductor pillar. A second gate structure including a first ring structure and a second ring structure is formed in a middle region of the second semiconductor pillar and of the third semiconductor pillar, the first ring structure surrounding the second semiconductor pillar, and the second ring structure surrounding the third semiconductor pillar.

DETAILED DESCRIPTION

In order to make the purposes, technical solutions and advantages of the present disclosure clearer, the technical solutions of the present disclosure are further described in details below in combination with the accompanying drawings and the embodiments. The described embodiments should not be regarded as limitations of the present disclosure. All other embodiments obtained by those of ordinary skill in the art without creative work shall fall within the scope of protection of the present disclosure.

The following description involves "some embodiments" which describe a subset of all possible embodiments, but it is to be understood that "some embodiments" may be the same or a different subset of all possible embodiments, and may be combined with each other without conflict.

If a similar description of "first/second" appears in the application document, the following description will be added. In the following description, the involved terms "first/second/third" are only used to distinguish similar objects, and do not represent a specific order of the objects. It is to be understood that the specific order or sequence of "first/second/third" may be interchangeable under the allowable circumstances, so that the embodiments of the present disclosure described herein may be implemented in an order other than those illustrated or described herein.

Unless otherwise defined, all technical and scientific terms used herein have the same meaning as that commonly understood by those skilled in the art of the present disclosure. The terms used herein is only for the purpose of describing the embodiments of the present disclosure and is not intended to limit the present disclosure.

Figure 1:
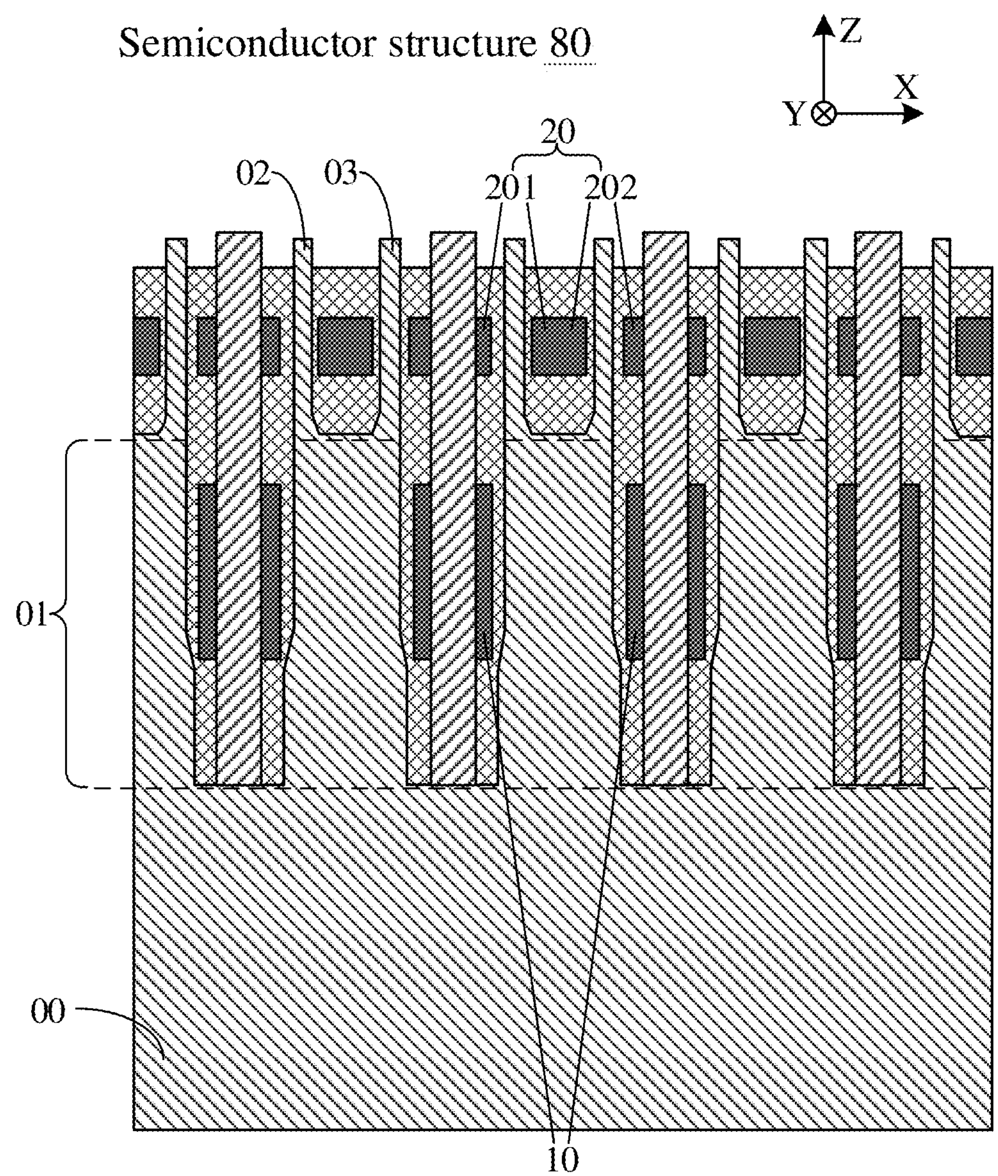
FIG. 1 is a first schematic diagram of a semiconductor structure provided by an embodiment of the present disclosure.

FIG. 1 is an optional schematic structural diagram of a semiconductor structure provided by an embodiment of the present disclosure, and FIG. 1 is a cross-sectional view. As shown in FIG. 1, the semiconductor structure 80 includes: a substrate 00, a first gate structure 10 and a second gate structure 20.

The substrate 00 includes discrete first semiconductor pillars/channels 01. The first semiconductor pillars 01 are arranged at a top of the substrate 00 and extend in a vertical direction Z. The substrate 00 further includes second semiconductor pillars 02 and third semiconductor pillars 03 extending in the vertical direction Z. The second semiconductor pillar 02 and the third semiconductor pillar 03 are provided at a top of each of the first semiconductor pillars 01.

The first gate structure 10 is arranged in a middle region of the first semiconductor pillar 01 and surrounds the first semiconductor pillar 01.

The second gate structure 20 is arranged in a middle region of the second semiconductor pillar 02 and of the third semiconductor pillar 03, and includes a first ring structure 201 and a second ring structure 202. The first ring structure 201 surrounds the second semiconductor pillar 02, and the second ring structure 202 surrounds the third semiconductor pillar 03.

In the embodiment of the present disclosure, the substrate 00 may include at least one of semiconductor materials, for example, group IV elements such as silicon (Si), germanium (Ge), and silicon germanium (SiGe), or group III-V compounds such as gallium arsenide (GaAs), aluminum gallium arsenide (AlGaAs), indium arsenide (InAs), or indium gallium arsenide (InGaAs). The following is exemplarily illustrated with the silicon element included in the substrate 00.

The first semiconductor pillar 01, the second semiconductor pillar 02 and the third semiconductor pillar 03 may have doping elements to improve their conductivity. Herein, the doping element may be a P-type doping element or an N-type doping element. The N-type doping element may be at least one of arsenic (As), phosphorus (P), or antimony (Sb) element. The P-type doping element may be at least one of boron (B), indium (In), or gallium (Ga) element.

The material for forming the first gate structure 10 and the second gate structure 20 may be titanium nitride (TiN), or at least one of conductive materials such as tantalum nitride (TaN), copper (Cu), or tungsten (W). The following is exemplarily illustrated with titanium nitride.

It is to be noted that, the first semiconductor pillar 01, the second semiconductor pillar 02 and the third semiconductor pillar 03 are filled with right slashes. The first semiconductor pillar 01 is a right-slashes-filling part between two dotted lines in FIG. 1, and the second semiconductor pillar 02 and the third semiconductor pillar 03 are right-slashes-filling parts located on the first semiconductor pillar 01. The first gate structure 10 is arranged in the middle region of the first semiconductor pillar 01. Herein, the middle region of the first semiconductor pillar 01 refers to a region between the top and the bottom of the first semiconductor pillar 01 in the vertical direction Z. Correspondingly, the second gate structure 20 is arranged in the middle region of the second semiconductor pillar 02 and of the third semiconductor pillar 03. Herein, the middle region of the second semiconductor pillar 02 and of the third semiconductor pillar 03 also refers to an region between the top and the bottom of the second semiconductor pillar 02 in the vertical direction Z, and an region between the top and the bottom of the third semiconductor pillar 03 in the vertical direction Z.

Figure 2:
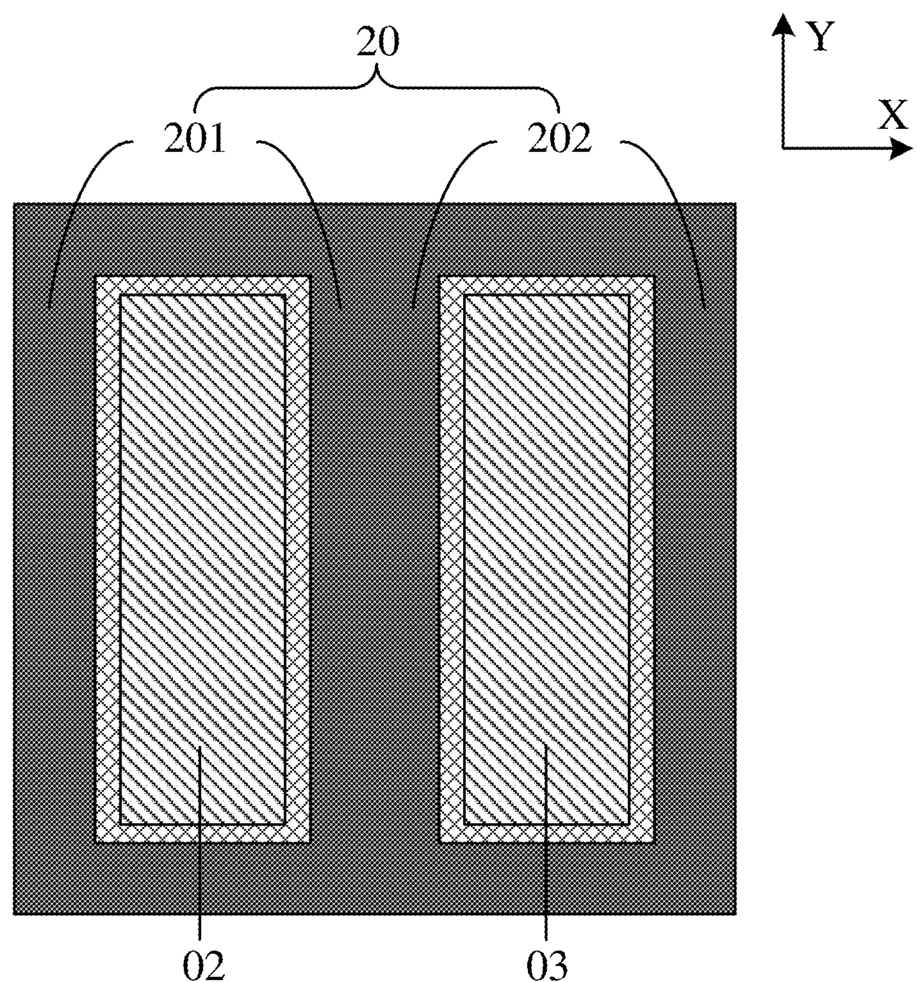
FIG. 2 is a second schematic diagram of a semiconductor structure provided by an embodiment of the present disclosure.
Figure 3:
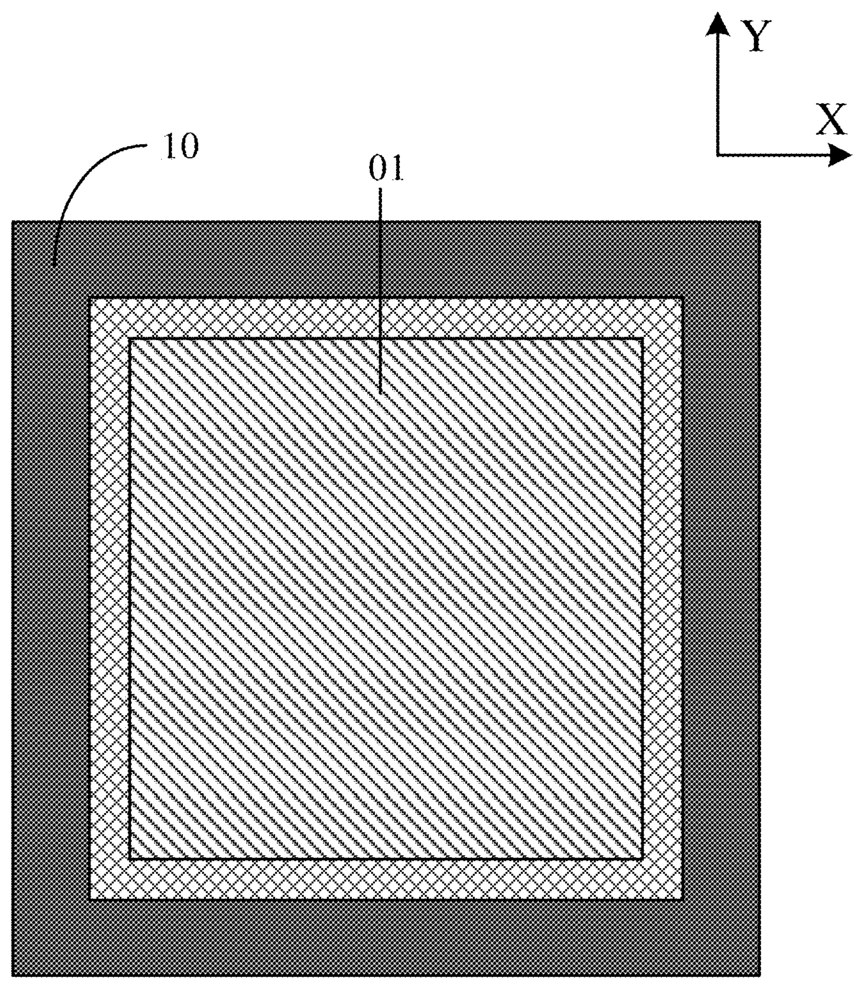
FIG. 3 is a third schematic diagram of a semiconductor structure provided by an embodiment of the present disclosure.

FIG. 2 and FIG. 3 are schematic structural diagrams from a top view. Herein, FIG. 2 shows a structural relationship among the second semiconductor pillar 02, the third semiconductor pillar 03 and the second gate structure 20 from a top view, and FIG. 3 shows a structural relationship between the first semiconductor pillar 01 and the first gate structure 10 from a top view.

As shown in FIG. 2, the second gate structure includes a first ring structure 201 and a second ring structure 202. Herein, the first ring structure 201 surrounds the second semiconductor pillar 02, and the second ring structure 202 surrounds the third semiconductor pillar 03. As shown in FIG. 3, the first gate structure 10 surrounds the first semiconductor pillar 01.

It is to be noted that, the second semiconductor pillar 02, the third semiconductor pillar 03, the second gate structure 20, the first semiconductor pillar 01 and the first gate structure 10 shown in FIG. 2 and FIG. 3 are all cross-sections perpendicular to the vertical direction Z. A first direction X and a second direction Y shown in FIG. 2 and FIG. 3 are both perpendicular to the vertical direction Z shown in FIG. 1. The first direction X and the second direction Y may be perpendicular to each other, and may also be at any included angle, and the following is exemplarily illustrated in a case where the first direction X is perpendicular to the second direction Y.

In the embodiment of the present disclosure, referring to FIG. 1, the first semiconductor pillar 01 and the first gate structure 10 may constitute a first transistor. Herein, the first gate structure 10 forms a gate of the first transistor, a part, surrounded by the first gate structure 10, of the first semiconductor pillar 01 forms a channel of the first transistor, and the first semiconductor pillar 01 on either side of the channel of the first transistor forms a source or drain of the first transistor. Correspondingly, the second semiconductor pillar 02 and the first ring structure 201 in the second gate structure 20 may constitute a second transistor. Herein, the first ring structure 201 forms a gate of the second transistor, a part, surrounded by the first ring structure 201, of the second semiconductor pillar 02 forms a channel of the second transistor, and the second semiconductor pillar 02 on either side of the pillar of the second transistor forms a source or drain of the second transistor. The third semiconductor pillar 03 and the second ring structure 202 in the second gate structure 20 may constitute a third transistor. Herein, the second ring structure 202 forms a gate of the third transistor, a part, surrounded by the second ring structure 202, of the third semiconductor pillar 03 forms a channel of the third transistor, and the third semiconductor pillar 03 on either side of the channel of the third transistor forms a source or drain of the third transistor.

The first transistor, the second transistor and the third transistor are all VGAA transistors, that is, the channels of the three transistors all extend in the vertical direction Z, and each of the first gate structure 10, the first ring structure 201 and the second ring structure 202 surrounds the respective corresponding channel. Therefore, under the same size, compared with the transistor structures such as a Fin Field-Effect Transistor (FinFET), the gate of each of the first transistor, the second transistor, and the third transistor may more sufficiently cover the channel, so that the control ability of the gate is stronger.

It is understandable that, the first semiconductor pillar 01 and the first gate structure 10 may form the first transistor, the second semiconductor pillar 02 and the first ring structure 201 may form the second transistor, and the third semiconductor pillar 03 and the second ring structure 202 may form the third transistor. Each of the first transistor, the second transistor and the third transistor may serve as an access transistor, that is, the gate of the first transistor, the gate of the second transistor and the gate of the third transistor may all receive control signals. In this way, the control ability of the gates of the three transistors may remedy each other. For example, if one transistor fails to turn off the semiconductor pillar completely, the gates of the other transistors may remedy it, so that the semiconductor pillar may be completely turned off, thereby reducing the leakage current in the semiconductor pillar, and improving the overall electrical performance of the semiconductor structure 80.

Figure 4:
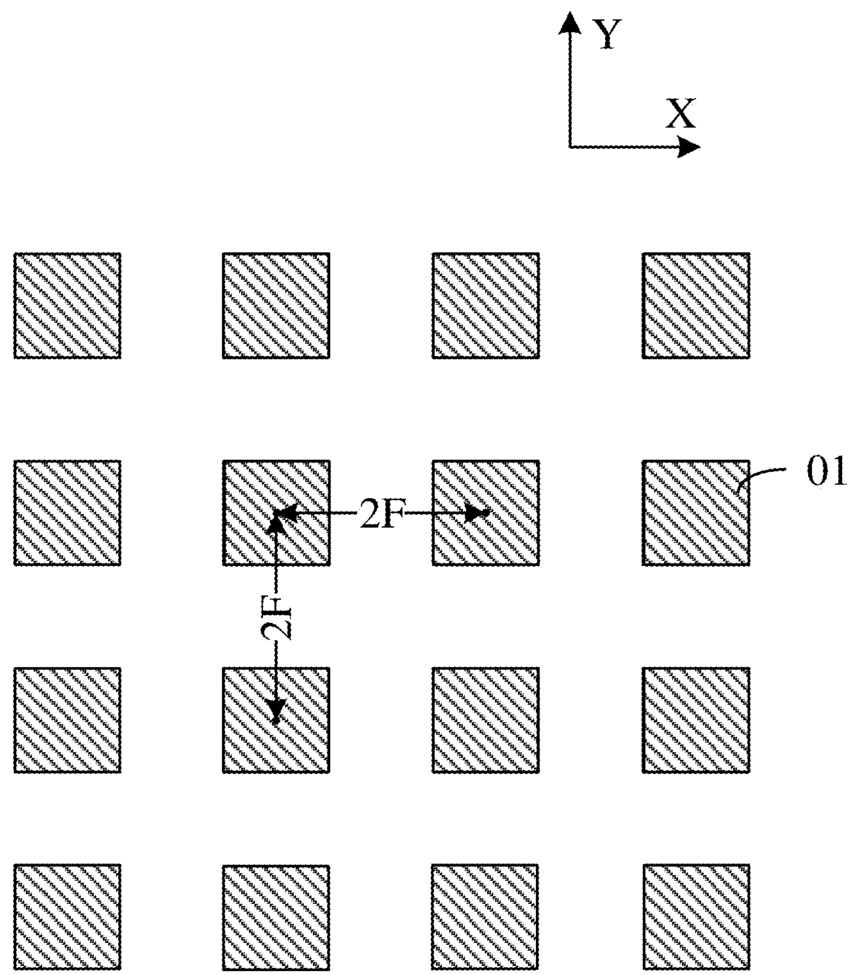
FIG. 4 is a fourth schematic diagram of a semiconductor structure provided by an embodiment of the present disclosure.

FIG. 4 is a schematic structural diagram from a top view, which shows the structure of a plurality of first semiconductor pillars 01 from a top view. In combination with FIG. 1 and FIG. 4, in the top view, the size of the first semiconductor pillar 01 satisfies $4F^2$ (F is the minimum pattern size obtainable under given process conditions), that is, the distance between center points of two adjacent first semiconductor pillars 01 in the first direction X is 2F, and the distance between center points of two adjacent first semiconductor pillars 01 in the second direction Y is also 2F. Therefore, the integration density of the semiconductor structure 80 is increased. In some embodiments, when a storage unit is formed on the semiconductor pillar 01, the storage unit may also be arranged according to $4F^2$.

In the embodiment of the present disclosure, referring to FIG. 1, both a width of the second semiconductor pillar 02 and a width of the third semiconductor pillar 03 are smaller than a width of the first semiconductor pillar 01, and the widths mentioned here may be the width in the first direction X.

In the embodiment of the present disclosure, referring to FIG. 1, a length of the second semiconductor pillar 02 in the vertical direction Z is equal to a length of the third semiconductor pillar 03 in the vertical direction Z, and both the length of the second semiconductor pillar 02 in the vertical direction Z and the length of the third semiconductor pillar 03 in the vertical direction Z are smaller than a length of the first semiconductor pillar 01 in the vertical direction Z. A length of the second gate structure 20 in the vertical direction Z is smaller than a length of the first gate structure 10 in the vertical direction Z.

It is understandable that, the first semiconductor pillar 01 may be set to be longer, and then the first gate structure 10 surrounding the first semiconductor pillar 01 may be set to be longer. In this way, the first gate structure 10 covers a larger area of the first semiconductor pillar 01, so that the control ability of the gate of the formed first transistor may be improved.

In the embodiment of the present disclosure, referring to FIG. 1, both a thickness of the first ring structure 201 and a thickness of the second ring structure 202 are greater than a thickness of the first gate structure 10, and the thicknesses mentioned here may be the thickness in the first direction.

It is understandable that, the first ring structure 201 and the second ring structure 202 may be set to be thicker, so that the resistance of the first ring structure 201 and the second ring structure 202 may be reduced, and the voltage loss of the gates of the formed second transistor and the third transistor can be reduced, thereby further improving the control ability of the gates of the second transistor and the third transistor.

Figure 5:
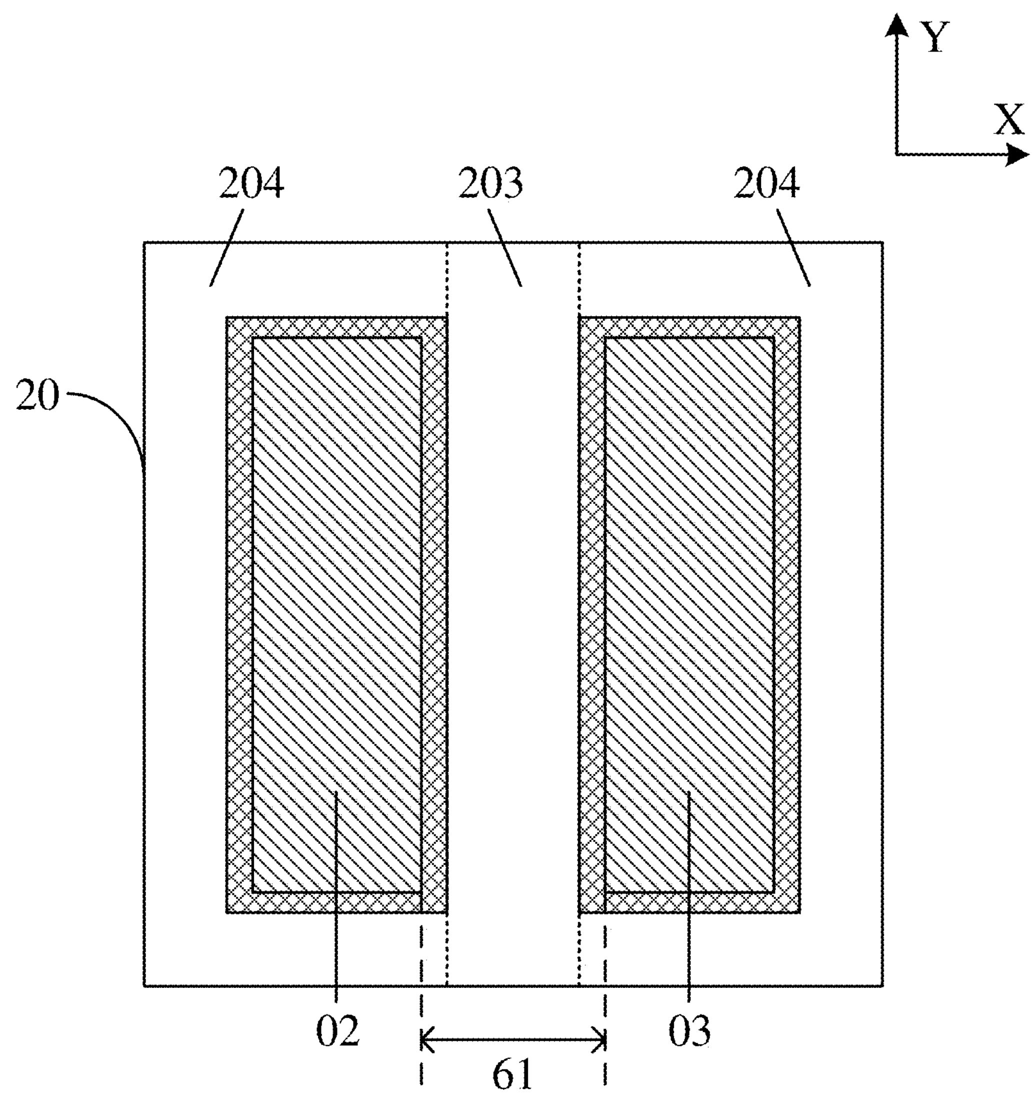
FIG. 5 is a fifth schematic diagram of a semiconductor structure provided by an embodiment of the present disclosure.

FIG. 5 is a schematic structural diagram from a top view. For the convenience of display, the second gate structure 20 is filled with white. In some embodiments of the present disclosure, in combination with FIG. 1 and FIG. 5, a groove 61 is formed in a region between the second semiconductor pillar 02 and the third semiconductor pillar 03 at the top of each of the first semiconductor pillars 01. The first ring structure 201 and the second ring structure 202 form a shared structure 203 in the groove 61, and the shared structure 203 passes through the groove 61. Other part of the second gate structure 20 other than the shared structure 203 forms a peripheral structure 204. A thickness of the peripheral structure 204 is smaller than a thickness of the shared structure 204, and the thicknesses mentioned to here may be the thickness in the first direction X.

It is understandable that, the shared structure 203 in the second gate structure 20 may be set to be thicker, which is beneficial to reduce the resistance of the second gate structure 20, and reduce the voltage loss of the gate of the formed transistor, thereby further improving the control ability of the transistor.

Figure 6:
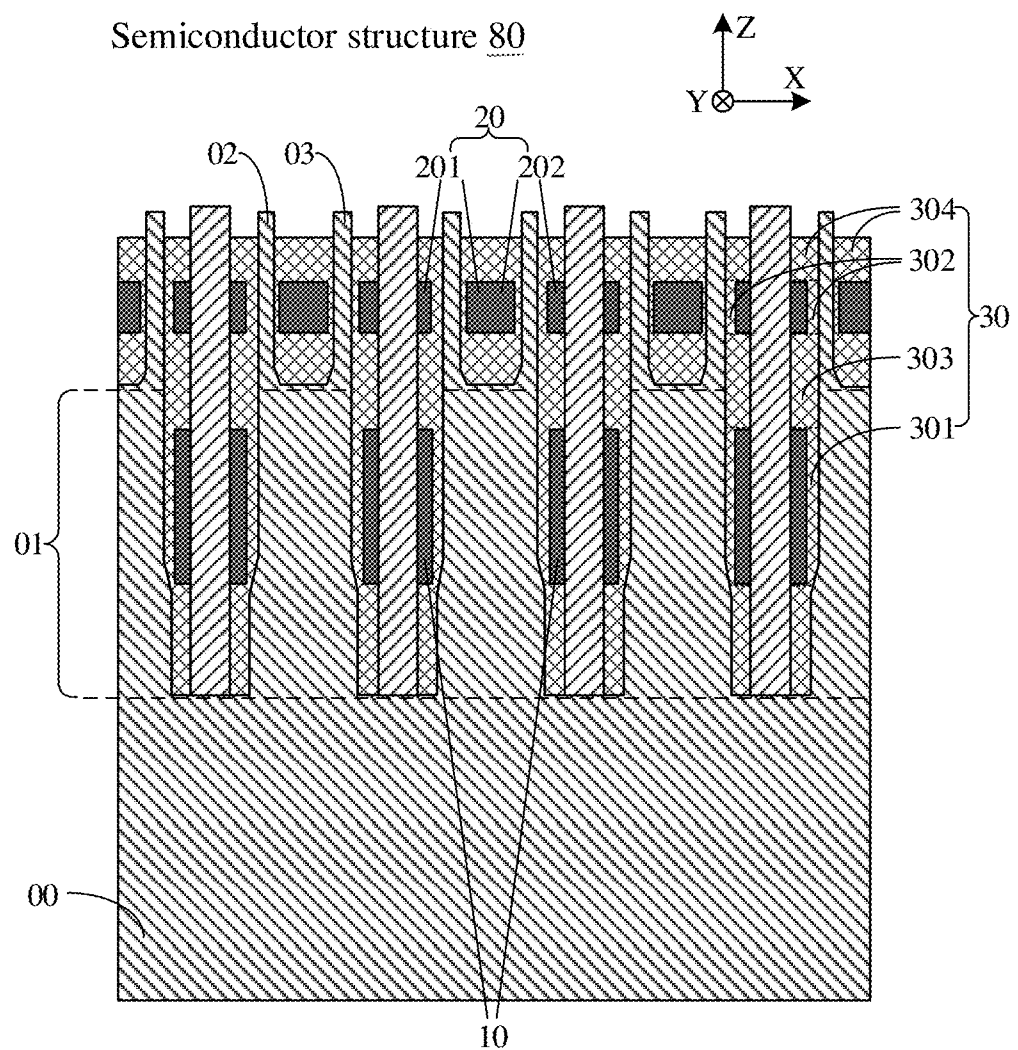
FIG. 6 is a sixth schematic diagram of a semiconductor structure provided by an embodiment of the present disclosure.

In some embodiments of the present disclosure, as shown in FIG. 6, the semiconductor structure 80 further includes a dielectric layer 30. The dielectric layer 30 includes: a first part 301, a second part 302 and a third part 303. Herein, the first part 301 of the dielectric layer 30 is located between the first gate structure 10 and the semiconductor pillar 01. The second part 302 of the dielectric layer 30 is located between the first ring structure 201 and the second semiconductor pillar 02, and between the second ring structure 202 and the third semiconductor pillar 03. The third part 303 of the dielectric layer 30 is located between the first gate structure 10 and the second gate structure 20. The first part 301, the second part 302 and the third part 303 are divided by dotted lines in FIG. 6.

In the embodiment of the present disclosure, as shown in FIG. 6, a thickness of the second part 302 of the dielectric layer 30 is smaller than a thickness of the first part 301 of the dielectric layer 30, and the thickness of the first part 301 of the dielectric layer 30 is smaller than a thickness of the third part 303 of the dielectric layer 30. The material for forming the dielectric layer 30 may be an insulating material such as silicon oxide (SiO). The first part 301 of the dielectric layer 30 may be used as a gate oxide layer of the first transistor to isolate the first gate 10 from the first semiconductor pillar 01. The second part 302 of the dielectric layer 30 may be used as a gate oxide layer of the second transistor and the third transistor to isolate the second semiconductor pillar 02 and the third semiconductor pillar 03 from the second gate 20.

It is understandable that, the first part 301 and the second part 302 of the dielectric layer 30 may be set to be thinner, which is beneficial to reduce the threshold voltage of the gates of the first transistor, the second transistor and the third transistor, thereby further improving the control ability of the gates of the transistors.

In some embodiments of the present disclosure, as shown in FIG. 6, the dielectric layer 30 further includes a fourth part 304. Herein, the fourth part 304 of the dielectric layer 30 is located above the second gate structure 20 and covers a top of the second gate structure 20. Both a top of the second semiconductor pillar 02 and a top of the third semiconductor pillar 03 are higher than a top of the fourth part 304 of the dielectric layer 30.

In the embodiment of the present disclosure, the fourth part 304 of the dielectric layer 30 covers the top of the second gate structure 20, so that the second gate structure 20 may be protected and a short circuit may be avoided. At the same time, the top of the second semiconductor pillar 02 and the top of the third semiconductor pillar 03 are both higher than the top of the fourth part 304 of the dielectric layer 30, that is, the top of the second semiconductor pillar 02 and the top of the third semiconductor pillar 03 are not covered by the fourth part 304 of the dielectric layer 30, so that the second semiconductor pillar 02 and the third semiconductor pillar 03 may be electrically connected with other structures above them.

Figure 7:
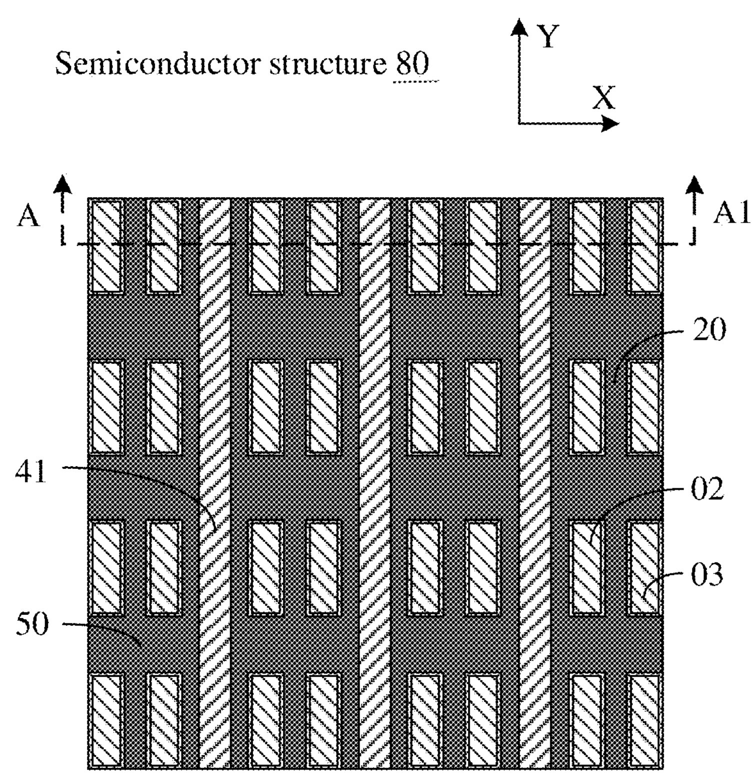
FIG. 7 is a seventh schematic diagram of a semiconductor structure provided by an embodiment of the present disclosure.
Figure 8:
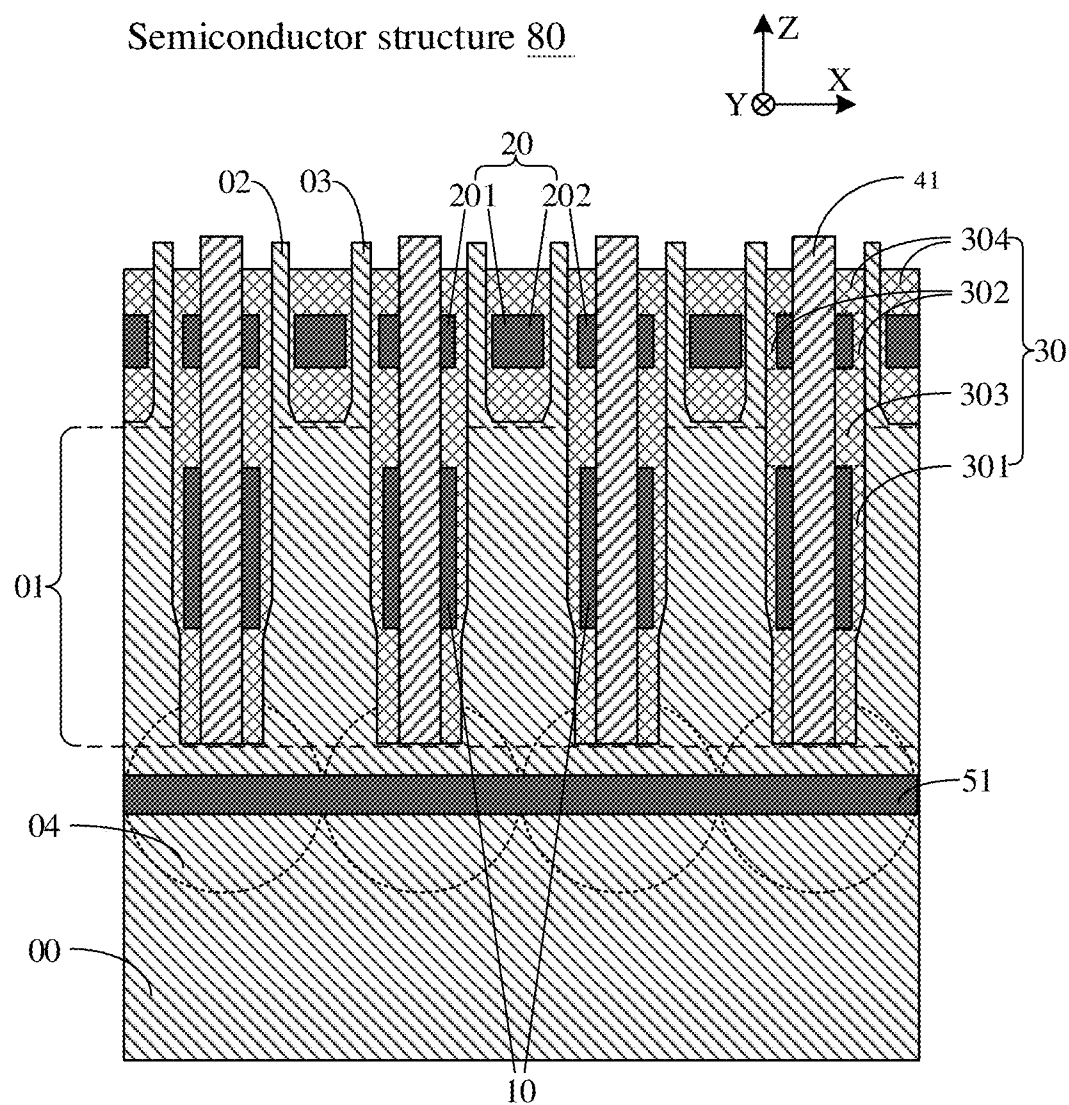
FIG. 8 is an eighth schematic diagram of a semiconductor structure provided by an embodiment of the present disclosure.

FIG. 7 and FIG. 8 are optional schematic structural diagrams of a semiconductor structure provided by an embodiment of the present disclosure, FIG. 7 is a top view, and FIG. 8 is a cross-sectional view taken in a cross-sectional line A-A1 in FIG. 7.

In some embodiments of the present disclosure, referring to FIG. 7 and FIG. 8, the semiconductor structure 80 further includes a first isolation layer 41. The first isolation layer 41 is located between the adjacent first semiconductor pillars 01, and the first gate structure 10 and the second gate structure 20 are located between the first isolation layer 41 and the first semiconductor pillar 01. The first isolation layer 41 extends in the second direction Y, and the material for forming the first isolation layer 41 may be silicon nitride (SiN).

In the embodiment of the present disclosure, referring to FIG. 7 and FIG. 8, the first gate structures 10 arranged in the second direction Y and the second gate structures 20 arranged in the second direction Y are respectively connected in series through a word line 50 extending in the second direction Y. The first gate structures 10 are connected in series by a first part of the word line 50 (not shown in FIG. 7 due to being shaded), the second gate structures 20 are connected in series by a second part of the word line 50, and the first isolation layer 41 is also configured to isolate the adjacent word lines 50.

It is understandable that, since the first gate structures 10 and the second gate structures 20 are respectively connected in series by the two parts of the word line 50, the two parts of the word line 50 jointly transmit signals on the word line, that is, the word line 50 is in contact with the first semiconductor pillar 01, the second semiconductor pillar 02 and the third semiconductor pillar 03 through both the first gate structure 10 and the second gate structure 20. In this way, the contact area between the word line 50 and each semiconductor pillar is increased, and the contact resistance between the word line 50 and each semiconductor pillar is reduced, thereby improving the electrical stability of the word line 50 and improving the control ability of the word line 50 to the first transistor, the second transistor and the third transistor.

In some embodiments of the present disclosure, as shown in FIG. 8, the semiconductor structure 80 further includes: a bit line 51. The bit line 51 is located in the substrate 00, and is electrically connected with the bottom of the first semiconductor pillar 01.

In the embodiment of the present disclosure, in combination with FIG. 7 and FIG. 8, the bit line 51 extends in the first direction X. The substrate 00 may further include metal silicide structures 04 (regions each surrounded by a circular dotted line frame). The metal silicide structures 04 are connected to form the bit line 51 electrically connected with the bottom of the first semiconductor pillar 01.

In the embodiment of the present disclosure, the material for forming the metal silicide structure 04 includes at least one of cobalt silicide, nickel silicide, molybdenum silicide, titanium silicide, tungsten silicide, tantalum silicide, or platinum silicide.

It is understandable that, compared with an un-metallized semiconductor material, the metal silicide structure 04 has a relatively small electrical resistivity, which is beneficial to reduce the resistance of the bit line 51 and reduce the contact resistance between the bit line 51 and the first semiconductor pillar 01, thereby further improving the electrical performance of the semiconductor structure 80.

In the embodiment of the present disclosure, as shown in FIG. 7 and FIG. 8, the bottom of the first semiconductor pillar 01 is used as the source or drain of the first transistor, and may be electrically connected with the bit line 51. The first gate structure 10 is used as the gate of the first transistor, the first ring structure 201 of the second gate structure 20 is used as the gate of the second transistor, and the second ring structure 202 of the second gate structure 20 is used as the gate of the second transistor. The gates of each of the three transistors may be connected in series through the word line 50. The top of the second semiconductor pillar 02 is used as the source or drain of the second transistor, and the top of the third semiconductor pillar 03 is used as the source or drain of the third transistor, each of which may be electrically connected with a subsequently formed capacitor structure.

Figure 9:
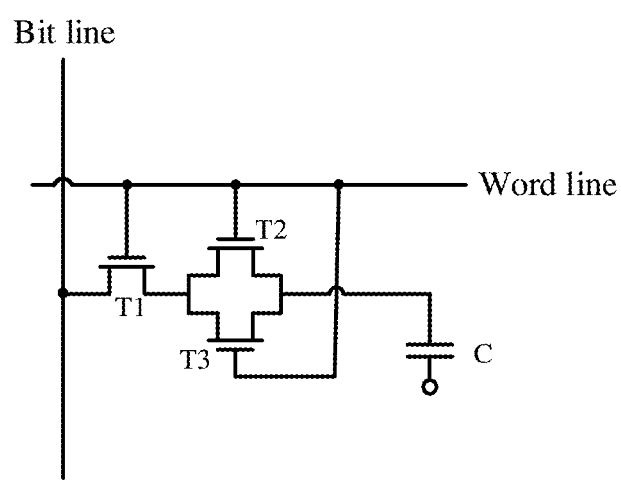
FIG. 9 is a ninth schematic diagram of a semiconductor structure provided by an embodiment of the present disclosure.

Thus, the semiconductor structure 80 may form a circuit as exemplified in FIG. 9, the first electrode of the first transistor T1 is connected with the bit line, the second electrode of the first transistor T1 is connected with the first electrode of the second transistor T2 and the first electrode of the third transistor T3. The second electrode of the second transistor T2 is connected with the second electrode of the third transistor T3 and a capacitor C, and the gate of the first transistor T1, the gate of the second transistor T2 and the gate of the third transistor T3 are all connected with the word line. In this way, a circuit structure of 3T-1C, that is, the circuit structure of three transistors and one capacitor, is formed, and may be used in the storage unit of a memory such as a Dynamic Random Access Memory (DRAM). In the circuit structure of 3T-1C, the word line may control the first transistor T1, the second transistor T2 and the third transistor T3 to be turned on or off, that is, the word line may control the electrical connection between the capacitor C and the bit line through the gate of the first transistor T1, the gate of the second transistor T2 and the gate of the third transistor T3, so that the control ability of the word line is higher. At the same time, the word line may be in contact with the semiconductor pillar through the three transistors, the contact area between the word line and the semiconductor pillar is larger, the contact resistance is smaller, and thus the electrical stability is higher.

Figure 10:
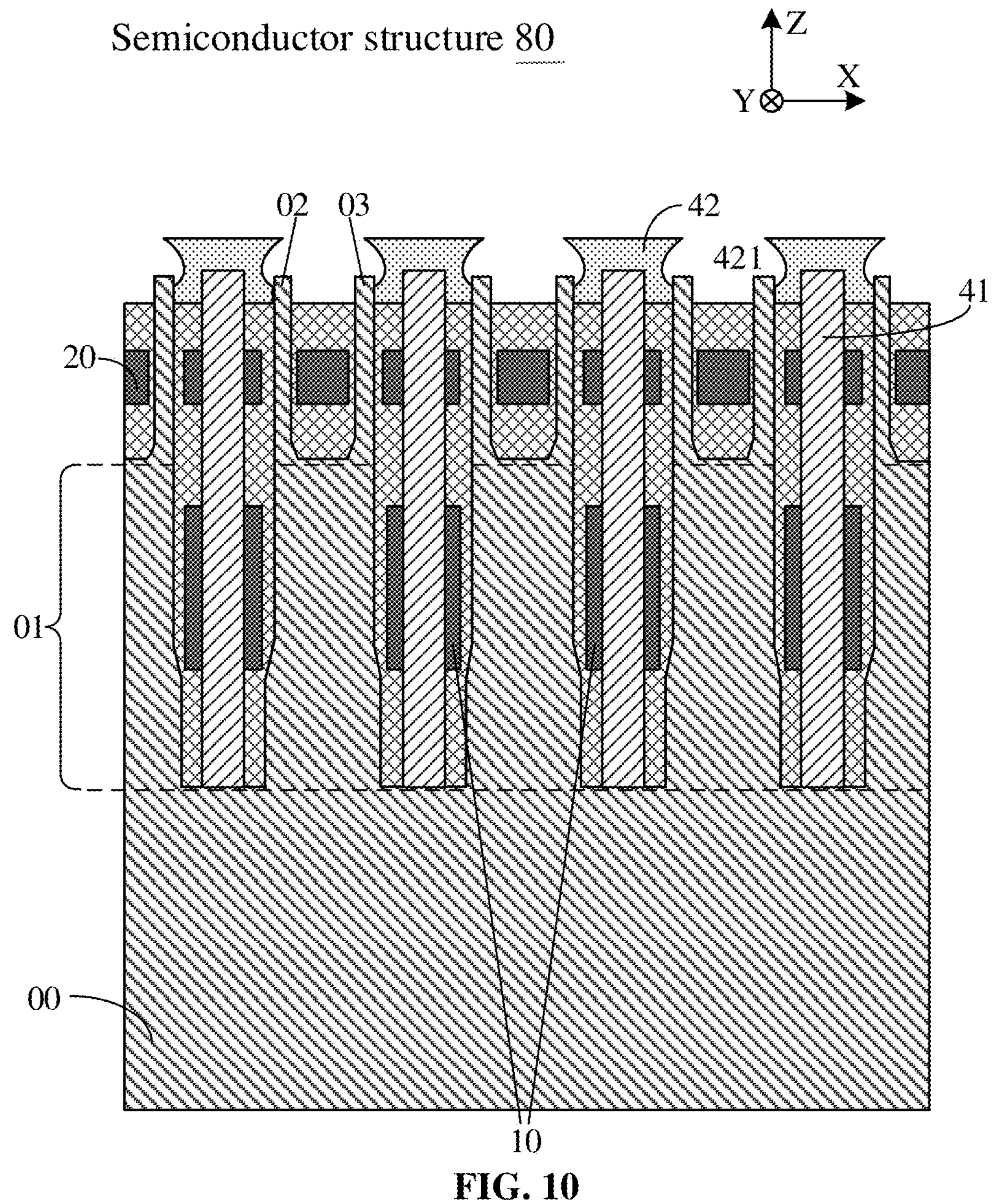
FIG. 10 is a tenth schematic diagram of a semiconductor structure provided by an embodiment of the present disclosure.

In some embodiments of the present disclosure, as shown in FIG. 10, the semiconductor structure 80 further includes: a covering layer 42. The covering layer 42 includes a first interconnecting hole 421. In the subsequent process, a contact electrode may be formed in each first interconnecting hole 421 to electrically connect the second semiconductor pillar 02 and the third semiconductor pillar 03 to the capacitor. The covering layer 42 is made of an insulating material.

In some embodiments of the present disclosure, referring to FIG. 10, a top of the first interconnecting hole 421 is higher than a top of the second semiconductor pillar 02 and of the third semiconductor pillar 03, so that the contact electrodes may be isolated from each other. The first interconnecting hole 421 is formed by etching the covering layer 42 according to a mask, and the material for forming the covering layer 42 may be silicon boron nitride ($SiB_xN_y$). Herein, the ratio of x to y represents a ratio of the number of boron atoms in the silicon boron nitride to the number of nitrogen atoms in the silicon boron nitride, and $4 \geq y > x > 0$, $y - x \leq 2$. In some embodiments, the silicon boron nitride is $SiB_2N_4$ or $SiB_{2.6}N_4$. It is to be noted that the representation method of $SiB_xN_y$ does not mean that the number of the silicon atoms is 1.

In some embodiments, when the silicon nitride is formed, the boron element is introduced into a cavity, thereby forming the silicon boron nitride, and at the same time, by controlling a flow ratio of nitrogen atoms to boron atoms, the ratio of the number of boron atoms to the number of nitrogen atoms in the silicon boron nitride may be adjusted. In the embodiments, since the silicon boron nitride is easier to be etched than silicon nitride, the boron atoms are doped into the silicon nitride, so that the stress of the silicon nitride may be reduced. That is, the stress of the silicon boron nitride is smaller, the internal interaction force thereof is smaller, and it is not easy to cause the structural damage, thereby improving the device performance. When the difference between the number of the nitrogen atoms and the number of the boron atoms is smaller than or equal to 2, the content of the nitrogen atoms in the silicon boron nitride may be increased, and thus the etch rate of the silicon boron nitride is increased, and the stress of the silicon boron nitride is small. If the difference between the number of the nitrogen atoms and the number of the boron atoms is greater than 2, the content of the boron atoms in the silicon boron nitride is low, the etch rate of the silicon boron nitride is low, and the stress of the silicon boron nitride is large.

Referring to FIG. 10, due to the larger etch rate of the covering layer 42, the middle width of the first interconnecting hole 421 may be set to be larger, which is beneficial to increase the surface area of an electrode plate and increase the capacitance.

It is understandable that, referring to FIG. 10, the covering layer 42 is etched below the tops of the second semiconductor pillar 02 and the third semiconductor pillar 03, so that the first interconnecting hole 421 may expose the tops of the two semiconductor pillars and part of each of the sidewalls close to the tops. In this way, the contact area between the two semiconductor pillars and the subsequently formed contact electrode is increased, thereby reducing the contact resistance and improving the electrical performance. Moreover, the diameter of a middle portion of the first interconnecting hole 421 is larger than the diameter of a top or bottom portion thereof. Correspondingly, the middle section of the contact electrode formed in the first interconnecting hole 421 is enlarged, so that the resistance is reduced.

Figure 11:
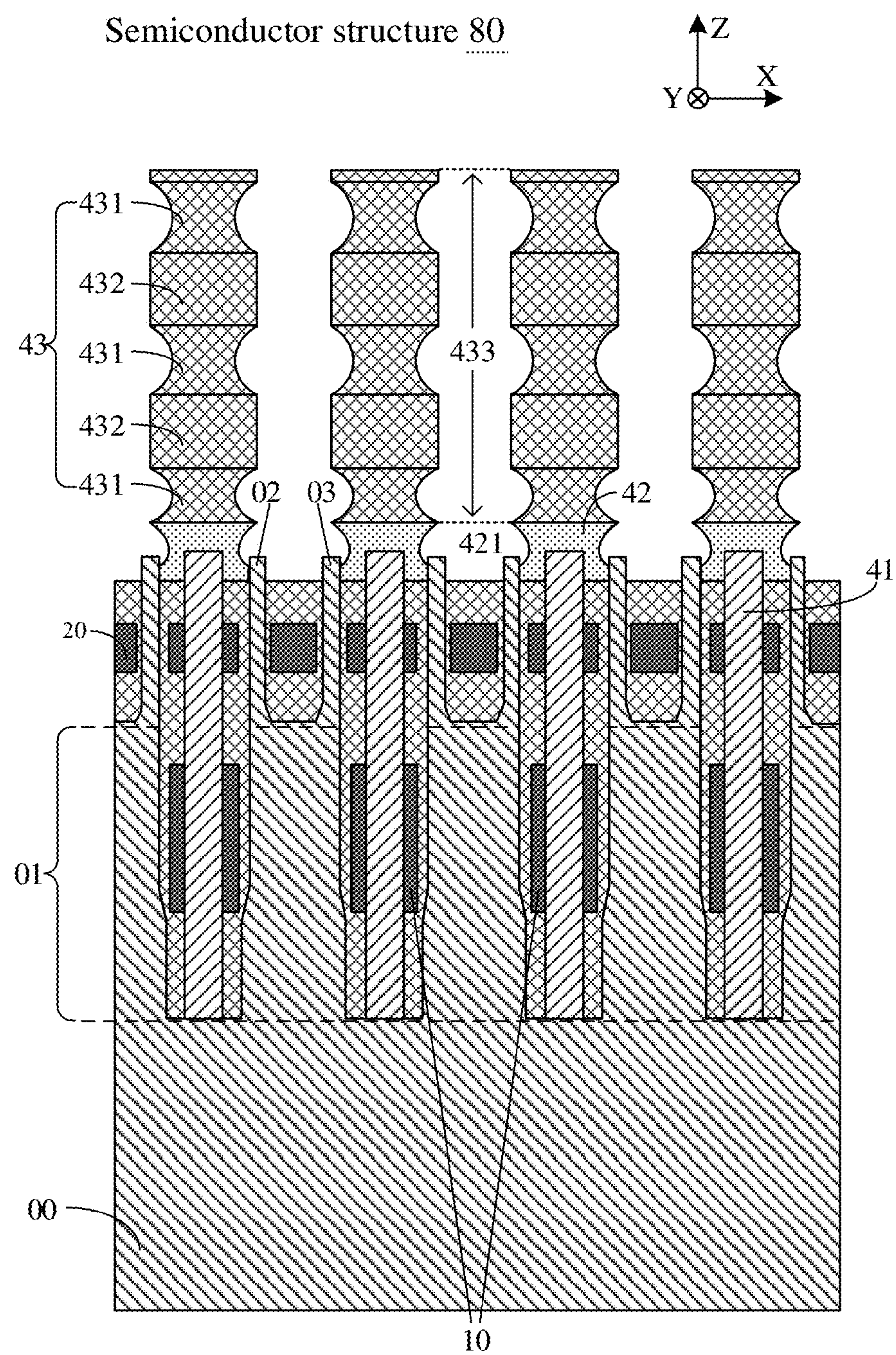
FIG. 11 is an eleventh schematic diagram of a semiconductor structure provided by an embodiment of the present disclosure.

In some embodiments of the present disclosure, as shown in FIG. 11, the semiconductor structure 80 further includes: a first sacrificial structure 43 located above the covering layer 42. The first sacrificial structure 43 includes additional doping regions 431 and body regions 432, and the additional doping regions 431 and the body regions 432 are alternately arranged in the vertical direction Z. The doping concentration in the additional doping region 431 is higher than the doping concentration in the body region 432. For example, if the material for forming the first sacrificial structure 43 is Boro-phospho-silicate Glass (BPSG) doped with the boron element, the boron content in the additional doping region 431 is higher than the boron content in the body region 432. Of course, in some embodiments, the body region 432 may also be un-doped BPSG.

In the embodiment of the present disclosure, an Ion Implantation (IMP) process may be used to dope the first sacrificial structure 43 to form the additional doping region 431. IMP is controlled by different energies, so that regions with different depths in the first sacrificial structure 43 may be doped, thereby forming the alternately arranged additional doping regions 431 and body regions 432 as shown in FIG. 11.

In some embodiments of the present disclosure, as shown in FIG. 11, the first sacrificial structure 43 includes a second interconnecting hole 433. In the subsequent process, a capacitor may be formed in the second interconnecting hole 433, and the capacitor is electrically connected with the semiconductor pillar 01.

In the embodiment of the present disclosure, the second interconnecting hole 433 is formed by etching according to a mask. Since the doping concentration of the boron in the additional doping region 431 is higher than the doping concentration of the boron in the body region 432, the additional doping region 431 is easier to be etched than the body region 432, and the additional doping region 431 is easier to form an isotropic etched structure. Referring to FIG. 11, the diameter of the second interconnecting hole 433 in the additional doping region 431 is larger than that in the body region 432, so that the cross-sectional profile of the inner sidewall of the second interconnecting hole 433 is wavy. It is understandable that, since the electrode plate of the capacitor formed in the second interconnecting hole 433 covers the inner sidewall of the second interconnecting hole 433, the inner sidewall of the second interconnecting hole 433 with the wavy cross-sectional profile may increase the area of the electrode plate of the capacitor, thereby increasing the capacity of the capacitor.

Further, the capacitor formed in the second interconnecting hole 433 is electrically connected with the semiconductor pillar 01 through a contact electrode, the contact electrode may be formed in the first interconnecting hole 421, and the first interconnecting hole 421 may expose the top of the semiconductor pillar 01 and part of the sidewall close to the top, so that the contact area between the semiconductor pillar 01 and the contact electrode is increased, thereby reducing the contact resistance and improving the electrical performance.

FIGS. 12 to 25 are partial structural diagrams of a semiconductor structure in steps, which are intended to describe and clearly illustrate the steps of the method for manufacturing the semiconductor structure, and FIGS. 12 to 25 are cross-sectional views. A first direction X and a second direction Y shown in FIGS. 12 to 25 are both perpendicular to a vertical direction Z shown in FIG. 1. The first direction X and the second direction Y may be perpendicular to each other, and may also be at any included angle, and the following is exemplarily illustrated in a case where the first direction X is perpendicular to the second direction Y.

In combination with FIGS. 12 to 25, the embodiments of the present disclosure further provide a method for manufacturing a semiconductor structure, which includes S101 to S103 and may be described in combination with each step.

At S101, a substrate 00 is provided.

Figure 12:
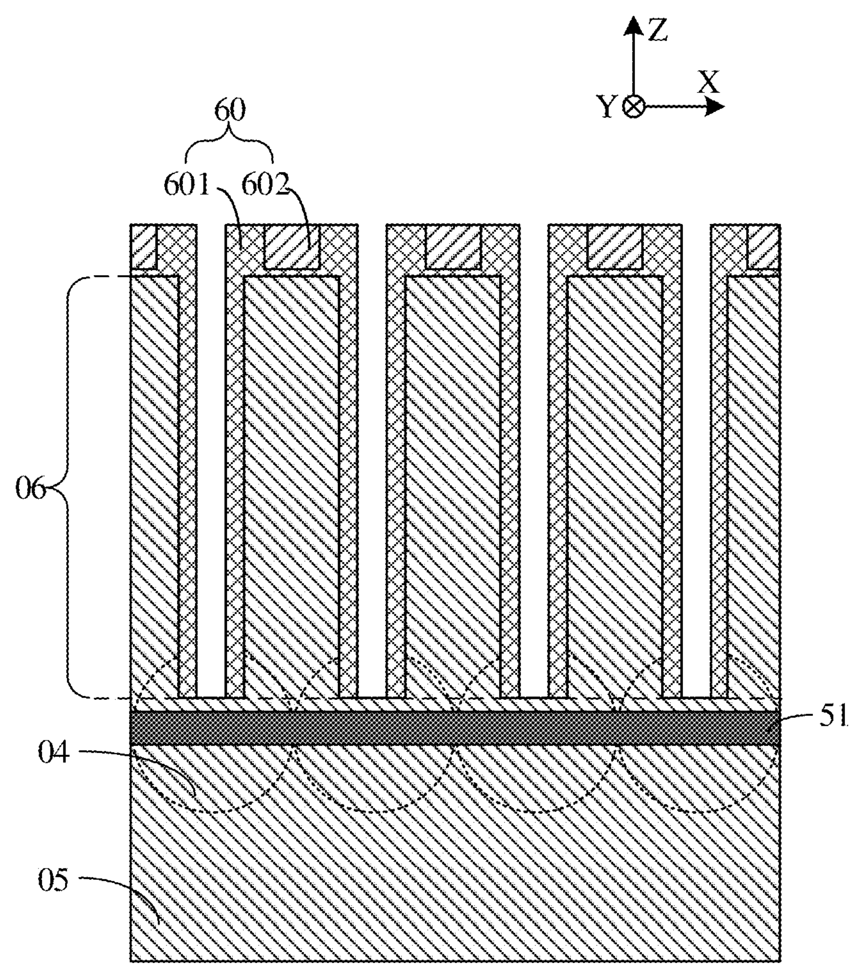
FIG. 12 is a first schematic diagram of a method for manufacturing a semiconductor structure provided by an embodiment of the present disclosure.

In the embodiment of the present disclosure, referring to FIG. 12, firstly, an initial substrate 05 may be provided, where the initial substrate 05 includes discrete initial semiconductor pillars 06 arranged at a top of the initial substrate 05 and extending in the vertical direction Z.

Herein, the initial substrate 05 may include at least one of semiconductor materials, for example, group IV elements such as silicon (Si), germanium (Ge), and silicon germanium (SiGe), or group III-V compounds such as gallium arsenide (GaAs), aluminum gallium arsenide (AlGaAs), indium arsenide (InAs), and indium gallium arsenide (InGaAs), and the following is exemplarily illustrated with the silicon element included in the initial substrate 05. The initial semiconductor pillar 06 may have doping elements to improve the conductivity of the initial semiconductor pillar 06. Herein, the doping element may be a P-type doping element or an N-type doping element, and the N-type doping element may be at least one of arsenic (As), phosphorus (P), or antimony (Sb) element. The P-type doping element may be at least one of boron (B), indium (In), or gallium (Ga) element.

In the embodiment of the present disclosure, referring to FIG. 12, the initial substrate 05 is further provided with a bit line 51 extending in the first direction X. The initial substrate 05 further includes metal silicide structures 04 (regions each surrounded by a circular dotted line frame). The metal silicide structures 04 are connected with each other to form the bit line 51. The bottom of the initial semiconductor pillar 06 is electrically connected with the bit line 51. The material for forming the metal silicide structure 04 includes at least one of cobalt silicide, nickel silicide, molybdenum silicide, titanium silicide, tungsten silicide, tantalum silicide, or platinum silicide.

Referring to FIG. 12, the initial semiconductor pillar 06 is also covered with a mask layer 60, a first part 601 of the mask layer 60 covers a sidewall and a top of the initial semiconductor pillar 06, and a second part 602 of the mask layer 60 is filled in the middle of the first part 601. The materials for forming the first part 601 and the second part 602 of the mask layer 60 are different, for example, the material for forming the first part 601 is silicon oxide, and the material for forming the second part 602 is silicon nitride.

Figure 13:
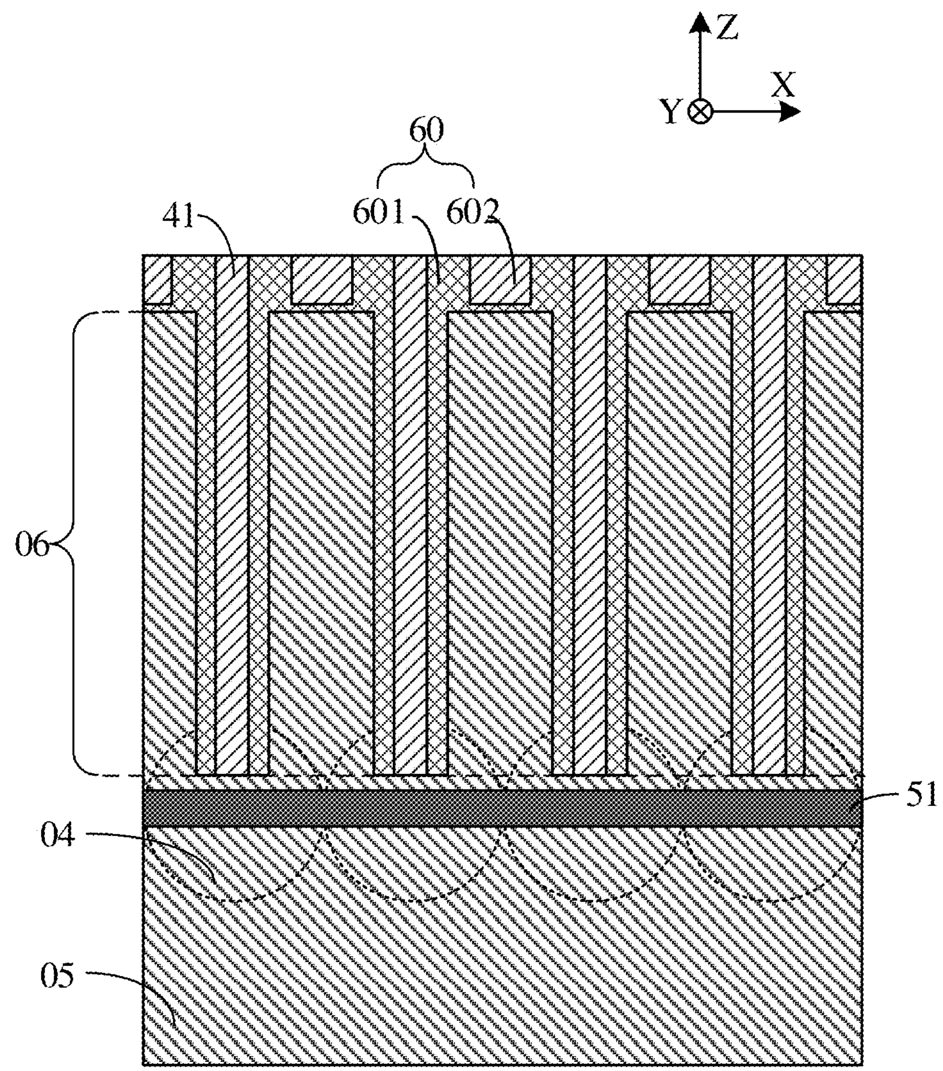
FIG. 13 is a second schematic diagram of a method for manufacturing a semiconductor structure provided by an embodiment of the present disclosure.
Figure 14:
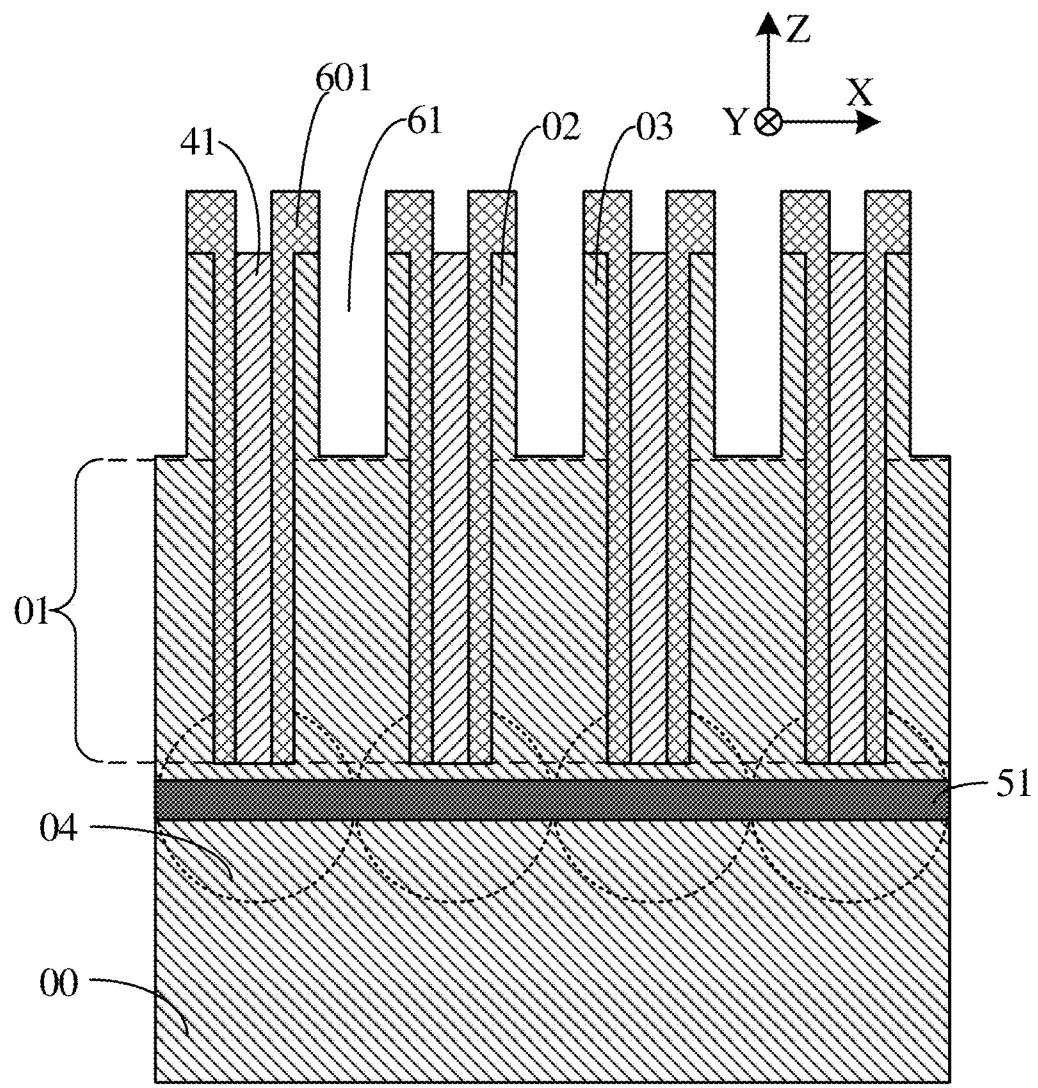
FIG. 14 is a third schematic diagram of a method for manufacturing a semiconductor structure provided by an embodiment of the present disclosure.
Figure 15:
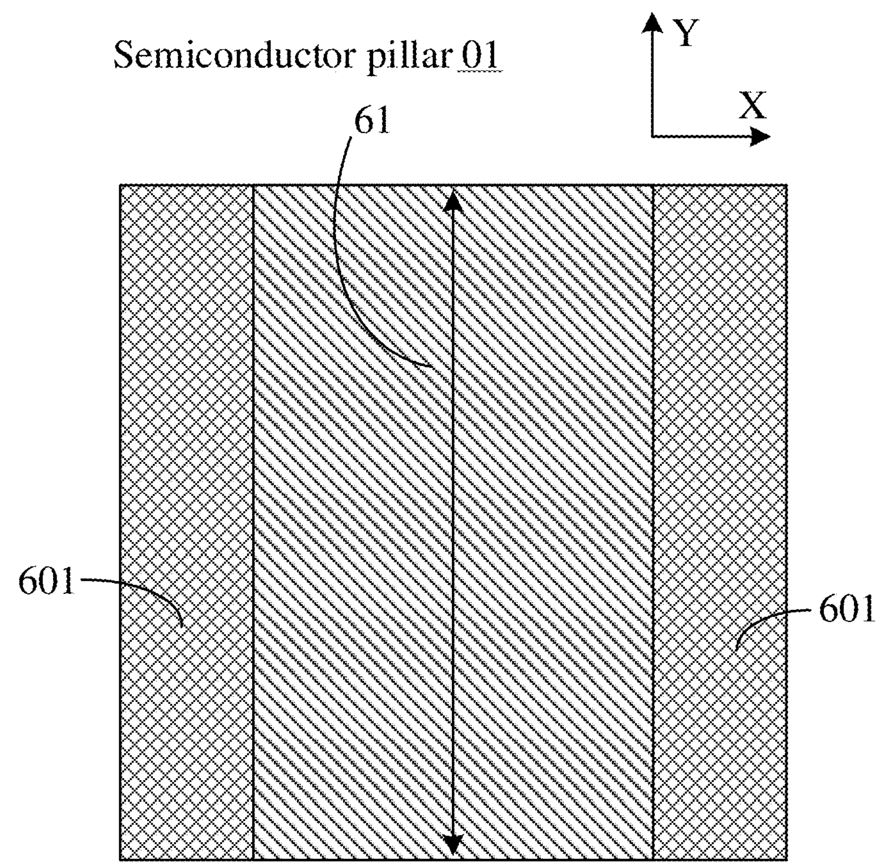
FIG. 15 is a fourth schematic diagram of a method for manufacturing a semiconductor structure provided by an embodiment of the present disclosure.

In the embodiment of the present disclosure, in combination with FIG. 13 and FIG. 14, etching may be performed according to a certain selection ratio, to remove only the second part 602 and a part of the initial semiconductor pillar 06 covered by the second part, and a groove 61 is formed in the middle of the initial semiconductor pillar 06. Thus, a part of the initial semiconductor pillar 06 remaining below the groove 61 forms a first semiconductor pillar 01, and parts of the initial semiconductor pillar 06 remaining on both sides of the groove 61 form a second semiconductor pillar 02 and a third semiconductor pillar 03. FIG. 15 is a top view of a single groove 61. In combination with FIGS. 13 to 15, the groove 61 extends in the second direction Y and penetrates the initial semiconductor pillar 06.

Thus, referring to FIG. 14, the substrate 00 is formed. The substrate 00 includes the discrete first semiconductor pillars 01. The first semiconductor pillars 01 are arranged at the top of the substrate 00 and extend in the vertical direction Z. The substrate 00 further includes second semiconductor pillars 02 and third semiconductor pillars 03 extending in the vertical direction Z. The second semiconductor pillar 02 and the third semiconductor pillar 03 which are symmetrical are provided at a top of each of the first semiconductor pillars 01.

In the embodiment of the present disclosure, in combination with FIG. 12 and FIG. 13, before the groove 61 is formed, a first isolation layer 41 may be formed by deposition. The first isolation layer 41 extends in the second direction Y to isolate the adjacent initial semiconductor pillars 06. The material for forming the first isolation layer 41 may be silicon nitride.

At S102, a first gate structure 10 surrounding the first semiconductor pillar 01 is formed in a middle region of the first semiconductor pillar 01.

Figure 16:
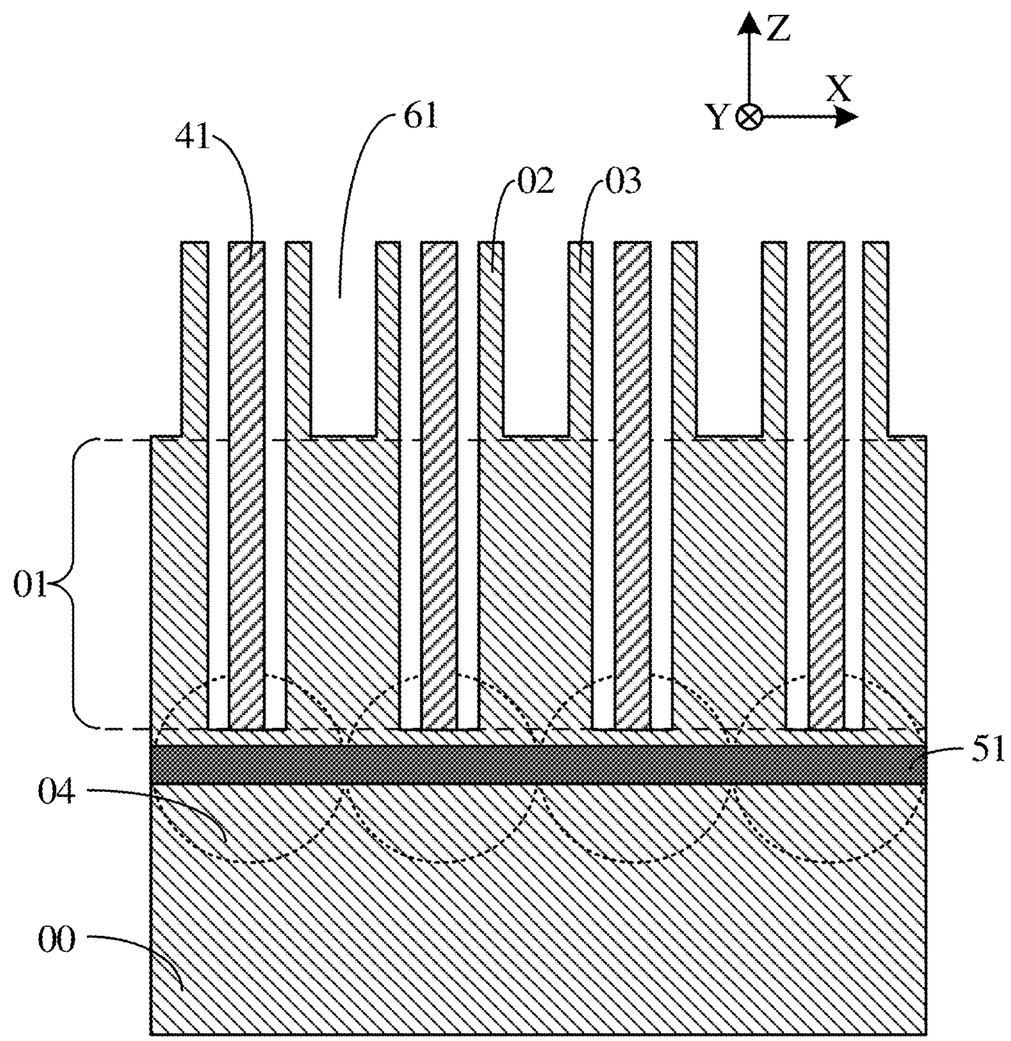
FIG. 16 is a fifth schematic diagram of a method for manufacturing a semiconductor structure provided by an embodiment of the present disclosure.

In the embodiment of the present disclosure, referring to FIG. 16, firstly, a part of a sidewall of the first semiconductor pillar 01 may be etched, so that a width of the middle region of the first semiconductor pillar 01 is smaller than a width of a bottom of first semiconductor pillar 01. In this way, a larger space may be provided for the subsequent formation of a first gate structure and even a second gate structure, and the above widths may be the width in the first direction X.

Figure 17:
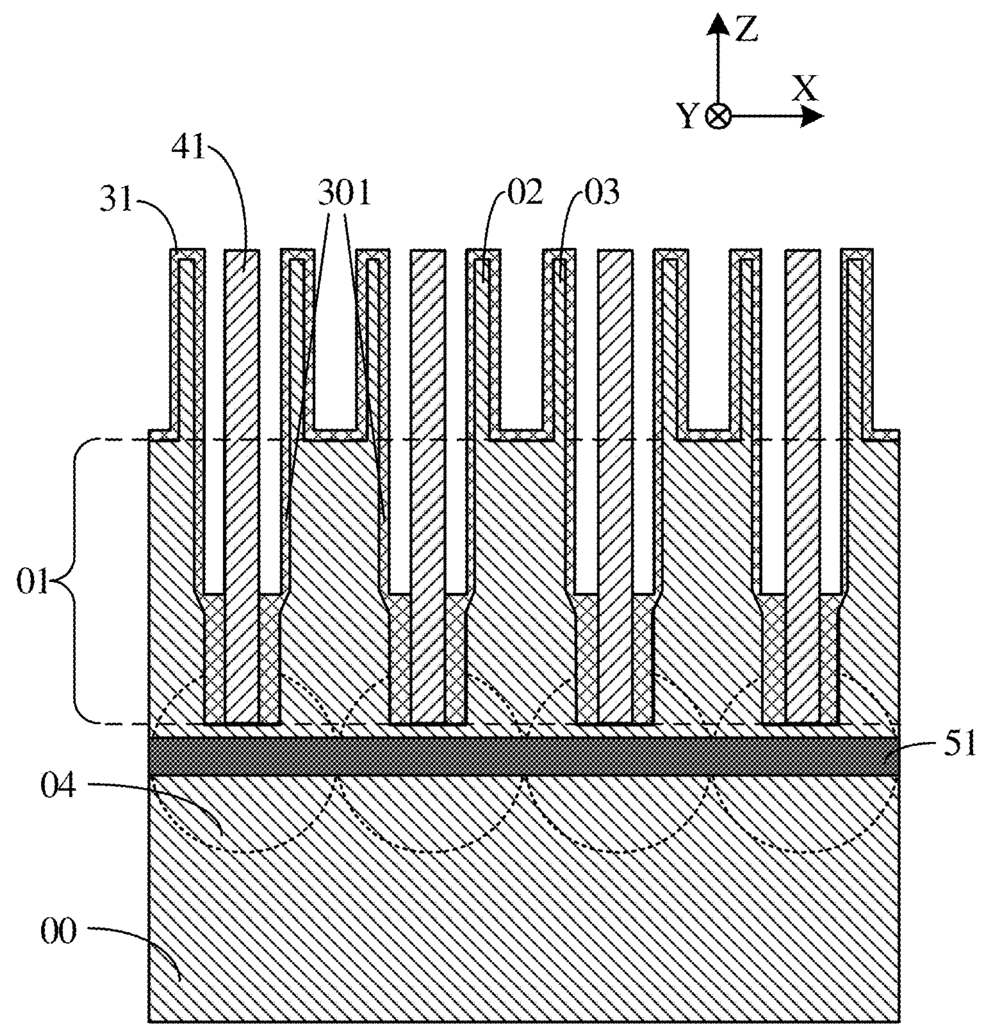
FIG. 17 is a sixth schematic diagram of a method for manufacturing a semiconductor structure provided by an embodiment of the present disclosure.

Then, referring to FIG. 16 and FIG. 17, a first initial dielectric layer 31 may be formed on the sidewall of the first semiconductor pillar. A part, located in the middle region of the first semiconductor pillar 01, of the first initial dielectric layer 31 forms a first part 301 of the dielectric layer. The material for forming the first initial dielectric layer 31 is an insulating material, which may be silicon oxide.

Figure 18:
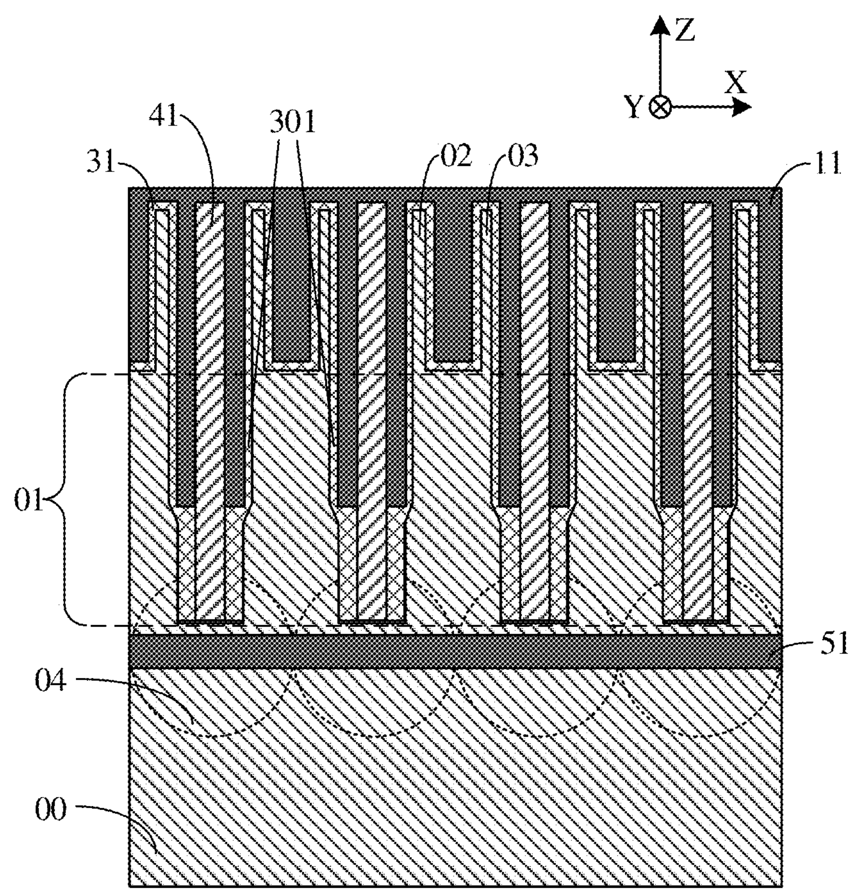
FIG. 18 is a seventh schematic diagram of a method for manufacturing a semiconductor structure provided by an embodiment of the present disclosure.

Then, referring to FIG. 17 and FIG. 18, a first gate layer 11 may be formed around a sidewall of the first initial dielectric layer 31. The material for forming the first gate layer 11 may be a conductive material such as titanium nitride.

Then, referring to FIG. 18 and FIG. 19, the first gate layer 11 may be etched back to etch the first gate layer 11 below the top of the first semiconductor pillar 01, and the remaining first gate layer 11 forms the first gate structure 10. The first part 301 of the dielectric layer is located between the first gate structure 10 and the first semiconductor pillar 01.

At S103, a second gate structure 20 is formed in a middle area of the second semiconductor pillar 02 and of the third semiconductor pillar 03.

In the embodiment of the present disclosure, before the second gate structure 20 is formed, the first initial dielectric layer 31 remaining on the sidewall of the second semiconductor pillar 02 and of the third semiconductor pillar 03 may be removed first.

Figure 19:
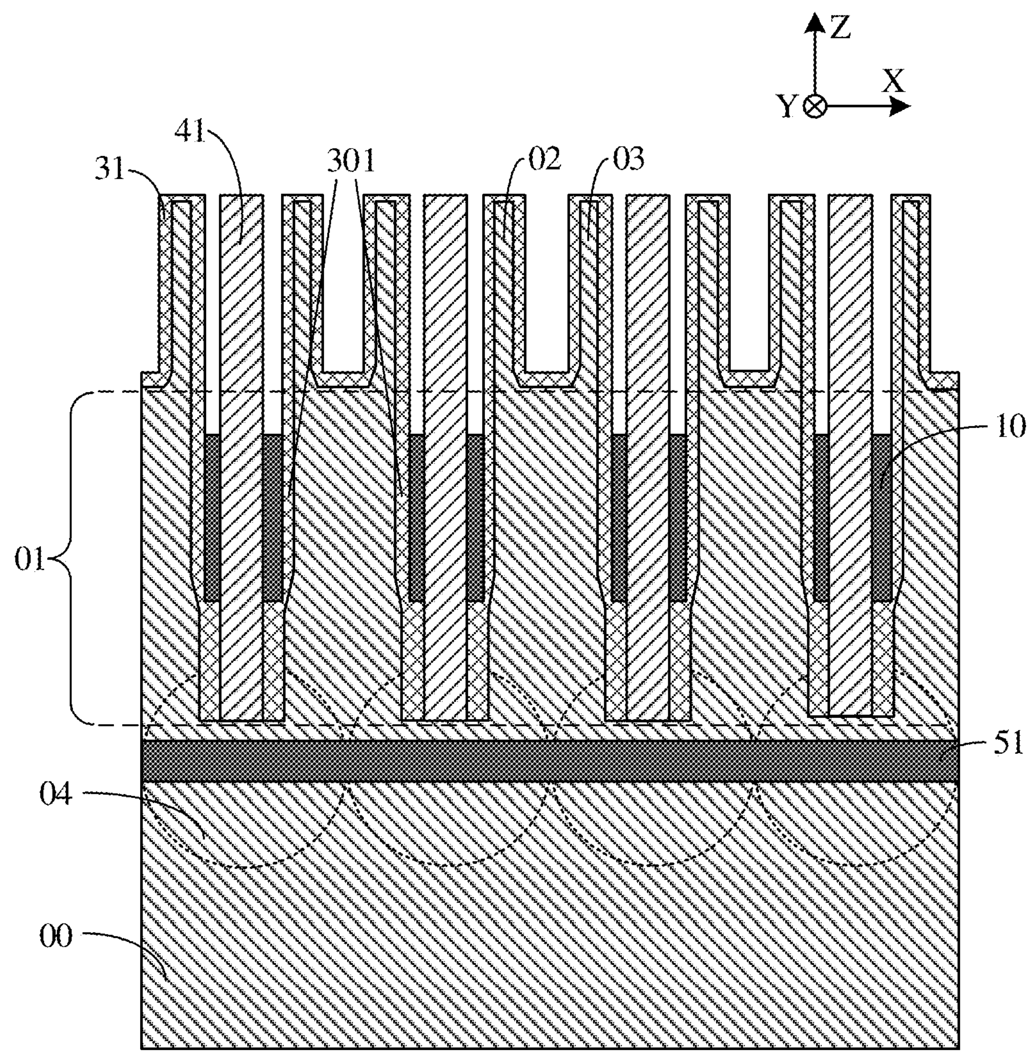
FIG. 19 is an eighth schematic diagram of a method for manufacturing a semiconductor structure provided by an embodiment of the present disclosure.
Figure 20:
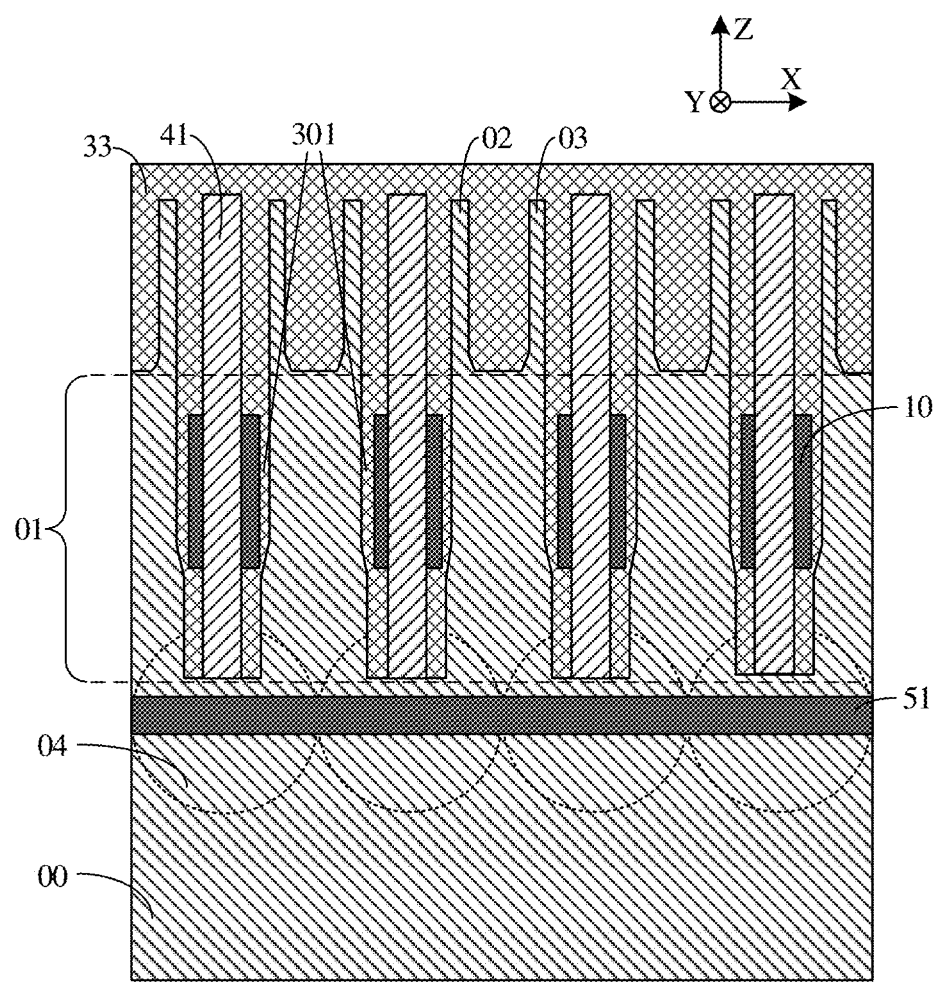
FIG. 20 is a ninth schematic diagram of a method for manufacturing a semiconductor structure provided by an embodiment of the present disclosure.

First, referring to FIG. 19 and FIG. 20, a sacrificial dielectric layer 33 may be formed to cover the second semiconductor pillar 02 and the third semiconductor pillar 03. The sacrificial dielectric layer 33 may be made of the same material as the first initial dielectric layer 31, or the sacrificial dielectric layer 33 may be made of a material with a similar etch rate to the first initial dielectric layer 31.

Figure 21:
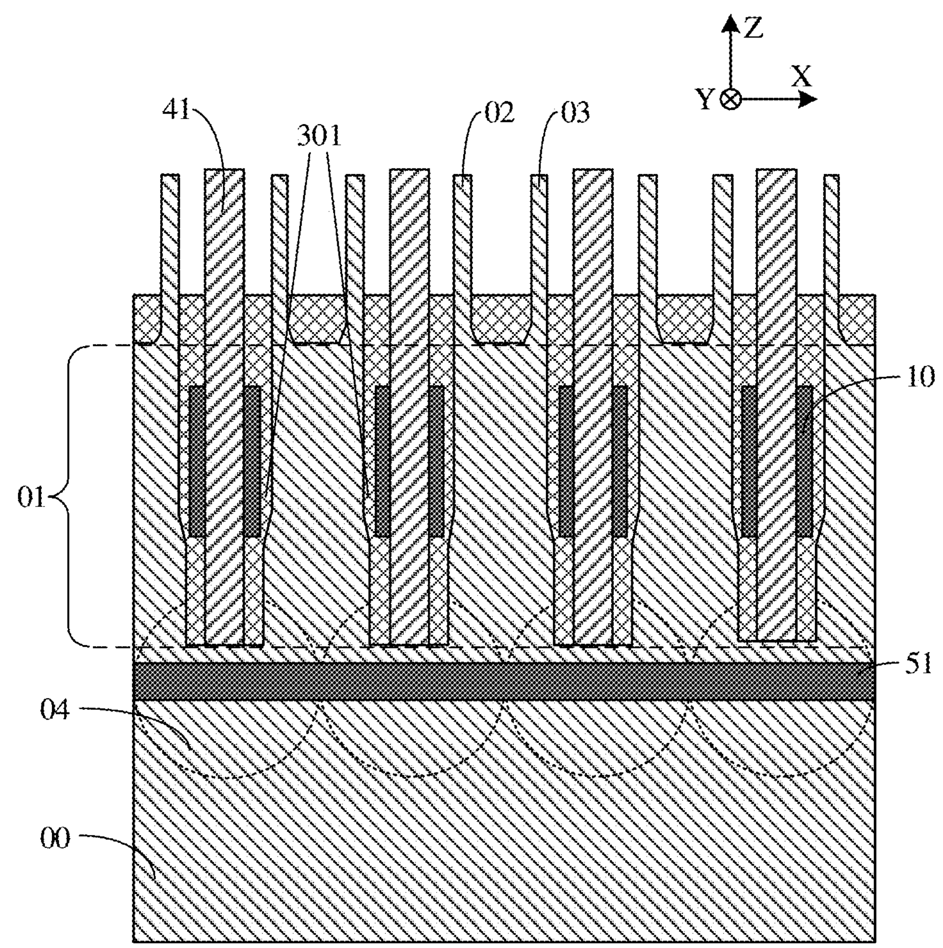
FIG. 21 is a tenth schematic diagram of a method for manufacturing a semiconductor structure provided by an embodiment of the present disclosure.

Then, referring to FIG. 20 and FIG. 21, etching may be performed to remove the dielectric layer on each of the sidewalls of the second semiconductor pillar 02 and the third semiconductor pillar 03, and the dielectric layer includes the sacrificial dielectric layer 33 and the remaining first initial dielectric layer 31. Therefore, the sidewalls of the second semiconductor pillar 02 and the third semiconductor pillar 03 are exposed, as shown in FIG. 21.

Figure 22:
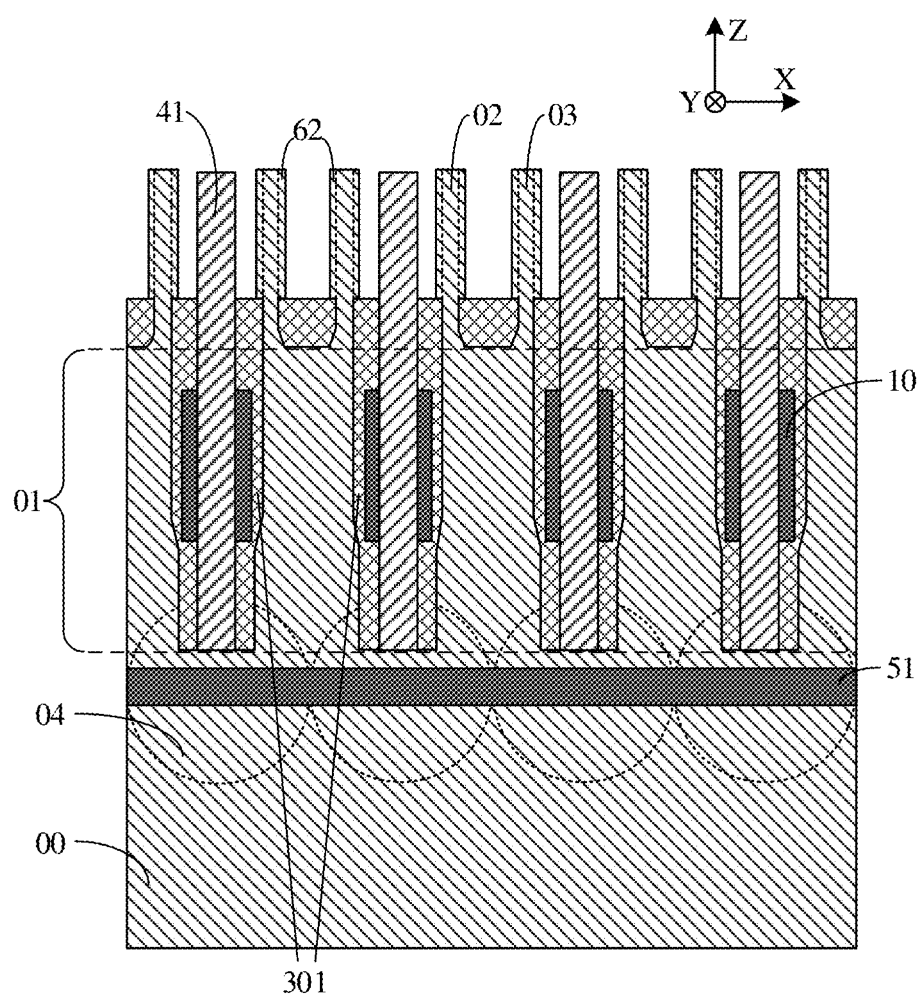
FIG. 22 is an eleventh schematic diagram of a method for manufacturing a semiconductor structure provided by an embodiment of the present disclosure.

In the embodiment of the present disclosure, in combination with FIG. 21 and FIG. 22, after the sidewalls of the second semiconductor pillar 02 and the third semiconductor pillar 03 are exposed, selective epitaxial growth may be performed on the sidewalls of the second semiconductor pillar 02 and the third semiconductor pillar 03 to form an epitaxial layer 62. The epitaxial layer 62 is the part divided by the dotted line in FIG. 22. It is to be noted that, selective epitaxial growth may be performed in a limited region, and the grown epitaxial layer 62 is a single crystal layer with the same crystal orientation as the second semiconductor pillar 02 and the third semiconductor pillar 03.

Figure 23:
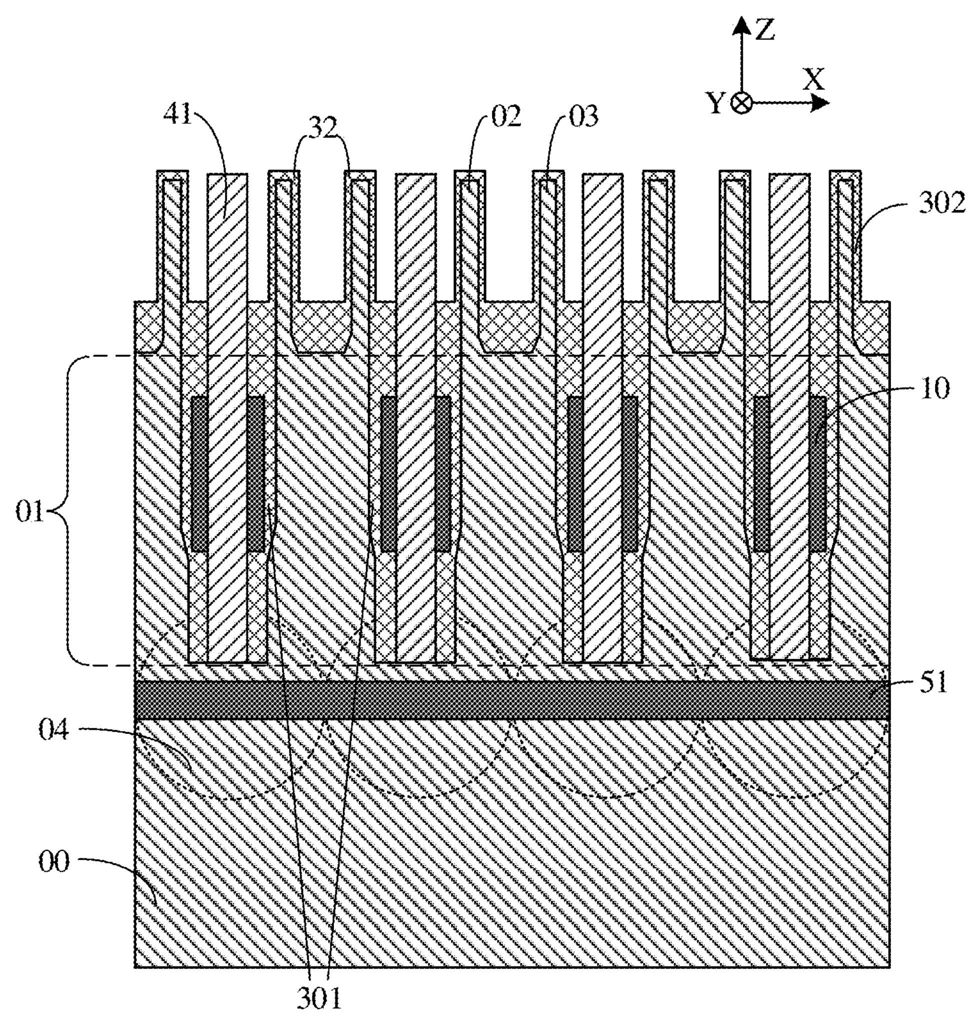
FIG. 23 is a twelfth schematic diagram of a method for manufacturing a semiconductor structure provided by an embodiment of the present disclosure.

Then, in combination with FIG. 22 and FIG. 23, the epitaxial layer 62 may be processed to form a second initial dielectric layer 32. Here, a reactive gas may be introduced into a cavity to react with the epitaxial layer 62 to generate the insulating second initial dielectric layer 32. The second initial dielectric layer 32 is formed on the sidewall of the second semiconductor pillar 02 and of the third semiconductor pillar 03, and the part, located in the middle area of the second semiconductor pillar 02 and of the third semiconductor pillar 03, of the second initial dielectric layer 32 forms a second part 302 of the dielectric layer.

Figure 24:
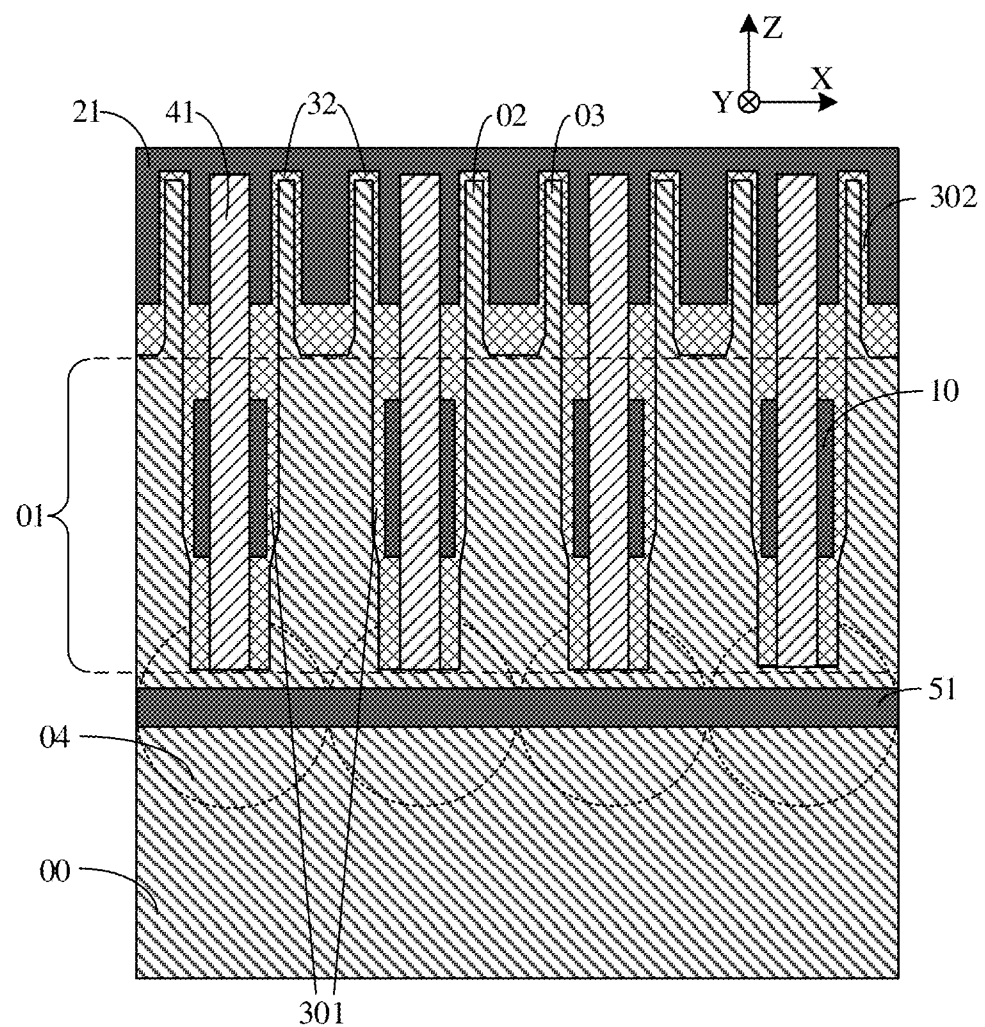
FIG. 24 is a thirteenth schematic diagram of a method for manufacturing a semiconductor structure provided by an embodiment of the present disclosure.

Then, in combination with FIG. 23 and FIG. 24, a second gate layer 21 may be formed around the sidewall of the second initial dielectric layer 32 on the second semiconductor pillar 02 and the third semiconductor pillar 03. The material for forming the second gate layer 21 may be a conductive material such as titanium nitride.

Figure 25:
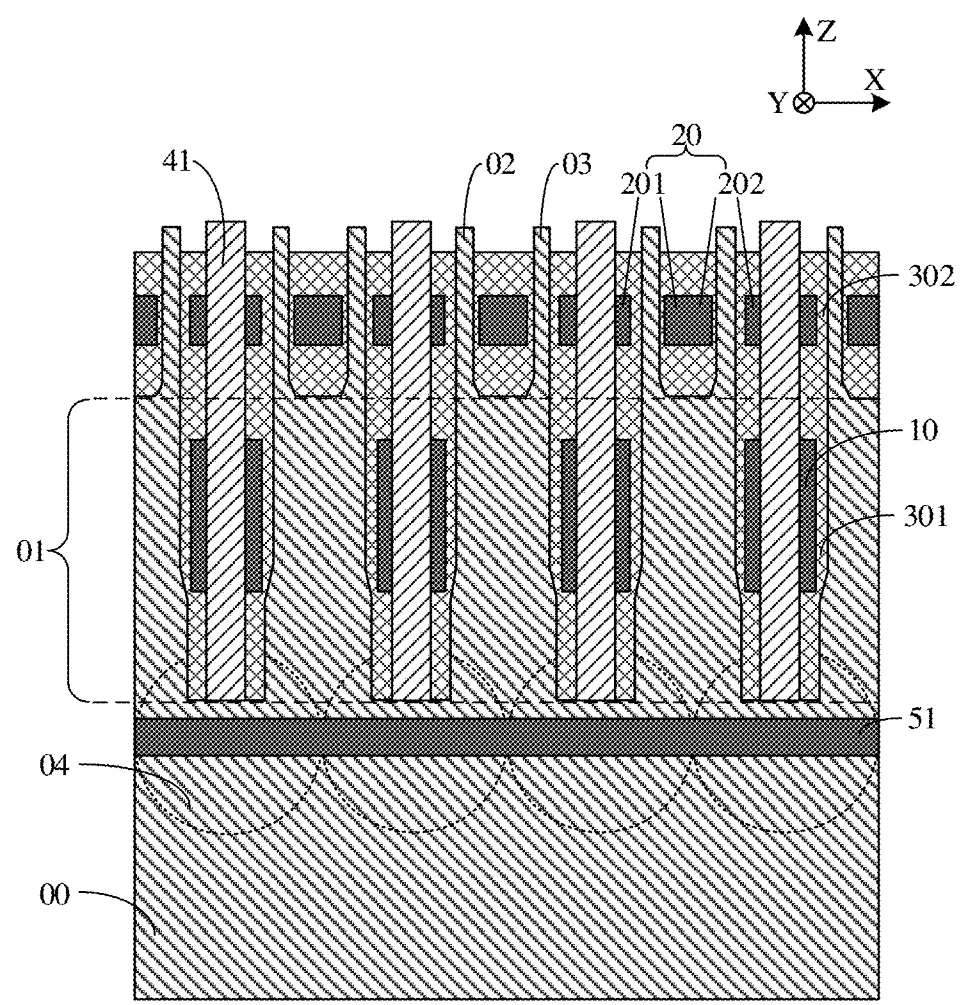
FIG. 25 is a fourteenth schematic diagram of a method for manufacturing a semiconductor structure provided by an embodiment of the present disclosure.

Then, in combination with FIG. 24 and FIG. 25, the second gate layer 21 may be etched back, and the remaining second gate layer 21 forms a first ring structure 201 and a second ring structure 202, thereby forming the second gate structure 20. As shown in FIG. 25, the first ring structure 201 is located in the middle region of the second semiconductor pillar 02, and the first ring structure 201 surrounds the second semiconductor pillar 02. The second ring structure 202 is located in the middle region of the third semiconductor pillar 03, and the second ring structure 202 surrounds the third semiconductor pillar 03. The second part 302 of the dielectric layer is located between the first ring structure 201 and the second semiconductor pillar 02, and between the second ring structure 202 and the third semiconductor pillar 03.

It is understandable that, the first semiconductor pillar 01 and the first gate structure 10 may form the first transistor, the second semiconductor pillar 02 and the first ring structure 201 may form the second transistor, and the third semiconductor pillar 03 and the second ring structure 202 may form the third transistor. The first transistor, the second transistor and the third transistor may all serve as access transistors, that is, the gate of the first transistor, the gate of the second transistor and the gate of the third transistor may all receive control signals. In this way, the control ability of the gates of the three transistors may remedy each other. For example, if one transistor fails to turn off the semiconductor pillar completely, the gates of the other transistors may remedy it, so that the semiconductor pillar may be completely turned off, thereby reducing the leakage current in the semiconductor pillar, and improving the overall electrical performance of the semiconductor structure 80.

In some embodiments of the present disclosure, in combination with FIGS. 12 to 15, the operation that the substrate 00 is formed includes S201 to S202, and may be described in combination with each step.

At S201, an initial substrate 05 is provided.

In the embodiment of the present disclosure, referring to FIG. 12, the initial substrate 05 includes discrete initial semiconductor pillars 06. The initial semiconductor pillars 06 are arranged at the top of the initial substrate 05 and extend in the vertical direction Z.

Herein, the initial substrate 05 may include at least one of semiconductor materials, for example, group IV elements such as silicon (Si), germanium (Ge), and silicon germanium (SiGe), or group III-V compounds such as gallium arsenide (GaAs), aluminum gallium arsenide (AlGaAs), indium arsenide (InAs), and indium gallium arsenide (InGaAs), and the following is exemplarily illustrated with the silicon element included in the initial substrate 05. The initial semiconductor pillar 06 may have doping elements to improve the conductivity of the initial semiconductor pillar 06. Herein, the doping element may be a P-type doping element or an N-type doping element, and the N-type doping element may be at least one of arsenic (As), phosphorus (P), or antimony (Sb) element. The P-type doping element may be at least one of boron (B), indium (In), or gallium (Ga) element.

At S202, a groove is formed at a top of the initial semiconductor pillar. The initial semiconductor pillar remaining on both sides of the groove forms the second semiconductor pillar and the third semiconductor pillar, and the initial semiconductor pillar remaining below the groove forms the first semiconductor pillar.

In the embodiment of the present disclosure, referring to FIG. 12, the initial semiconductor pillar 06 is also covered with the mask layer 60. The first part 601 of the mask layer 60 covers the sidewall and the top of the initial semiconductor pillar 06, and the second part 602 of the mask layer 60 is filled in the middle of the first part 601. The materials for forming the first part 601 and the second part 602 of the mask layer 60 are different, for example, the material for forming the first part 601 is silicon oxide, and the material for forming the second part 602 is silicon nitride.

In the embodiment of the present disclosure, referring to FIG. 13 and FIG. 14, etching may be performed according to a certain selection ratio, to remove only the second part 602 and the part of the initial semiconductor pillar 06 covered by the second part, so that the groove 61 is formed in the middle of the initial semiconductor pillar 06. Thus, the part of the initial semiconductor pillar 06 remaining below the groove 61 forms the first semiconductor pillar 01, and parts of the initial semiconductor pillar 06 remaining on both sides of the groove 61 form the second semiconductor pillar 02 and the third semiconductor pillar 03 respectively, that is, the substrate 00 is formed.

FIG. 15 is a top view of a single groove 61. In combination with FIGS. 13 to 15, the groove 61 extends in the second direction Y and penetrates the initial semiconductor pillar 06.

It is understandable that, the groove 61 is formed by etching the initial semiconductor pillar 06, so that the initial semiconductor pillar 06 is processed to form the first semiconductor pillar 01, the second semiconductor pillar 02 and the third semiconductor pillar 03, thereby providing the basis for forming the first transistor, the second transistor and the third transistor.

In some embodiments of the present disclosure, in combination with FIGS. 16 to 19, the operation that the first gate structure 10 is formed includes S301 to S304, and may be described in combination with each step.

At S301, part of the sidewall of the first semiconductor pillar 01 is etched, so that the width of the middle region of the first semiconductor pillar 01 is smaller than the width of the bottom of the first semiconductor pillar 01.

In the embodiment of the present disclosure, referring to FIG. 16, part of the sidewall of the first semiconductor pillar 01 may be etched, so that the width of the middle region of the first semiconductor pillar 01 is smaller than the width of the bottom of the first semiconductor pillar 01. In this way, a larger space may be provided for the subsequent formation of the first gate structure and even the second gate structure, and the above widths may be the width in the first direction X.

At S302, the first initial dielectric layer is formed on the sidewall of the first semiconductor pillar.

In the embodiment of the present disclosure, referring to FIG. 16 and FIG. 17, the first initial dielectric layer 31 may be formed on the sidewall of the first semiconductor pillar. The part, located in the middle region of the first semiconductor pillar 01, of the first initial dielectric layer 31 forms the first part 301 of the dielectric layer. The material for forming the first initial dielectric layer 31 is an insulating material, which may be silicon oxide.

At S303, the first gate layer is formed around the sidewall of the first initial dielectric layer.

In the embodiment of the present disclosure, referring to FIG. 17 and FIG. 18, the first gate layer 11 may be formed around the sidewall of the first initial dielectric layer 31. The material for forming the first gate layer 11 may be a conductive material such as titanium nitride.

At S304, the first gate layer is etched to form a first gate structure.

In the embodiment of the present disclosure, the first gate layer 11 may be etched back, and the first gate layer 11 may be etched below the top of the first semiconductor pillar 01, and the remaining first gate layer 11 forms the first gate structure 10. The first part 301 of the dielectric layer is located between the first gate structure 10 and the first semiconductor pillar 01.

In some embodiments of the present disclosure, in combination with FIGS. 22 to 25, the operation that the second gate structure 20 is formed includes S401 to S403, and may be described in combination with each step.

At S401, the second initial dielectric layer 32 is formed on the sidewall of the second semiconductor pillar 02 and of the third semiconductor pillar 03.

In the embodiment of the present disclosure, in combination with FIG. 22 and FIG. 23, the second initial dielectric layer 32 may be formed on the sidewall of the second semiconductor pillar 02 and of the third semiconductor pillar 03. The part, located in the middle region of the second semiconductor pillar 02 and of the third semiconductor pillar 03, of the second initial dielectric layer 32 forms the second part 302 of the dielectric layer.

At S402, the second gate layer 21 is formed around the sidewall of the second initial dielectric layer 32 on the second semiconductor pillar 02 and the third semiconductor pillar 03.

In the embodiment of the present disclosure, in combination with FIG. 23 and FIG. 24, the second gate layer 21 may be formed around the sidewall of the second initial dielectric layer 32 on the second semiconductor pillar 02 and the third semiconductor pillar 03. The material for forming the second gate layer 21 may be a conductive material such as titanium nitride.

At S403, the second gate layer 21 is etched to form the first ring structure 201 and the second ring structure 202, thereby forming the second gate structure 20.

In the embodiment of the present disclosure, in combination with FIG. 24 and FIG. 25, the second gate layer 21 may be etched back, and the remaining second gate layer 21 forms the first ring structure 201 and the second ring structure 202, thereby forming the second gate structure 20.

As shown in FIG. 25, the first ring structure 201 is located in the middle region of the second semiconductor pillar 02, and the first ring structure 201 surrounds the second semiconductor pillar 02. The second ring structure 202 is located in the middle region of the third semiconductor pillar 03, and the second ring structure 202 surrounds the third semiconductor pillar 03. The second part 302 of the dielectric layer is located between the first ring structure 201 and the second semiconductor pillar 02, and between the second ring structure 202 and the third semiconductor pillar 03.

In some embodiments of the present disclosure, in combination with FIGS. 21 to 23, the operation that the second initial dielectric layer 21 is formed includes S404 to S405, and may be described in combination with each step.

At S404, selective epitaxial growth is performed on the sidewall of the second semiconductor pillar 02 and of the third semiconductor pillar 03 to form the epitaxial layer 62.

In the embodiment of the present disclosure, in combination with FIG. 21 and FIG. 22, selective epitaxial growth may be performed on the sidewall of the second semiconductor pillar 02 and of the third semiconductor pillar 03 to form the epitaxial layer 62. The epitaxial layer 62 is the part divided by the dotted line in FIG. 22. It is to be noted that, selective epitaxial growth may be performed in a limited region, and the grown epitaxial layer 62 is a single crystal layer with the same crystal orientation as the second semiconductor pillar 02 and the third semiconductor pillar 03.

At S405, the epitaxial layer 62 is processed to form the second initial dielectric layer 21.

In the embodiment of the present disclosure, in combination with FIG. 22 and FIG. 23, the epitaxial layer 62 may be processed to form the second initial dielectric layer 32. Here, the reactive gas may be introduced into the cavity to react with the epitaxial layer 62 to generate the insulating second initial dielectric layer 32.

It is to be noted that, in the present disclosure, terms “include” and “contain” or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the present disclosure are adopted not to represent superiority-inferiority of the embodiments but only for description. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiments. The features disclosed in several method or device embodiments provided in the present disclosure may be combined arbitrarily without conflict to obtain new method embodiments or device embodiments.

The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

Embodiments of the present disclosure provide a semiconductor structure and a method for manufacturing the same. The semiconductor structure includes: a substrate, a first gate structure, and a second gate structure. Herein, the substrate includes discrete first semiconductor pillars arranged at a top of the substrate and extending in a vertical direction. The substrate further includes second semiconductor pillars and third semiconductor pillars extending in the vertical direction, and the second semiconductor pillar and the third semiconductor pillar are provided at a top of each of the first semiconductor pillars. The first gate structure is arranged in a middle region of the first semiconductor pillar and surrounds the first semiconductor pillar. The second gate structure is arranged in a middle region of the second semiconductor pillar and of the third semiconductor pillar, and includes a first ring structure and a second ring structure.

The first ring structure surrounds the second semiconductor pillar, and the second ring structure surrounds the third semiconductor pillar. In this way, the first semiconductor pillar and the first gate structure may form a first transistor, the second semiconductor pillar and the first ring structure may form a second transistor, the third semiconductor pillar and the second ring structure may form a third transistor, a gate of the first transistor, a gate of the second transistor and a gate of the third transistor may all receive control signals, and controlled structures are increased. At the same time, the first gate structure surrounds the first semiconductor pillar, the first ring structure surrounds the second semiconductor pillar, and the second ring structure surrounds the third semiconductor pillar, so that the coverage area of each semiconductor pillar is increased, and the gate control ability of the formed first transistor, second transistor and third transistor is improved. Thus, the embodiments of the present disclosure improve the overall electrical performance of the semiconductor structure.

What is claimed is:

1. A semiconductor structure, comprising:

a substrate, comprising: discrete first semiconductor pillars arranged at a top of the substrate and extending in a vertical direction; and second semiconductor pillars and third semiconductor pillars extending in the vertical direction, wherein a second semiconductor pillar of the second semiconductor pillars and a third semiconductor pillar of the third semiconductor pillars are provided at a top of each of the first semiconductor pillars;

a first gate structure, arranged in a middle region of a first semiconductor pillar of the first semiconductor pillars and surrounding the first semiconductor pillar;

a second gate structure, arranged in a middle region of the second semiconductor pillar and of the third semiconductor pillar, and comprising a first ring structure and a second ring structure, the first ring structure surrounding the second semiconductor pillar, and the second ring structure surrounding the third semiconductor pillar;

a bit line, located in the substrate, and electrically connected with a bottom of the first semiconductor pillar; and a covering layer comprising a first interconnecting hole, wherein a contact electrode is formed in the first interconnecting hole to electrically connect the second semiconductor pillar and the third semiconductor pillar to a capacitor.

2. The semiconductor structure of claim 1, wherein, a groove is formed in a region between the second semiconductor pillar and the third semiconductor pillar at the top of each of the first semiconductor pillars; and the first ring structure and the second ring structure form a shared structure in the groove, the shared structure passing through the groove.

3. The semiconductor structure of claim 1, wherein, both a width of the second semiconductor pillar and a width of the third semiconductor pillar are smaller than a width of the first semiconductor pillar; and a length of the second semiconductor pillar in the vertical direction is equal to a length of the third semiconductor pillar in the vertical direction and both the length of the second semiconductor pillar in the vertical direction and the length of the third semiconductor pillar in the vertical direction are smaller than a length of the first semiconductor pillar in the vertical direction.

4. The semiconductor structure of claim 1, wherein, both a thickness of the first ring structure and a thickness of the second ring structure are greater than a thickness of the first gate structure.

5. The semiconductor structure of claim 2, wherein, an other part of the second gate structure other than the shared structure forms a peripheral structure; and a thickness of the peripheral structure is smaller than a thickness of the shared structure.

6. The semiconductor structure of claim 1, further comprising: a dielectric layer comprising a first part, a second part, and a third part;

wherein the first part of the dielectric layer is located between the first gate structure and the first semiconductor pillar;

the second part of the dielectric layer is located between the first ring structure and the second semiconductor pillar, and between the second ring structure and the third semiconductor pillar; and the third part of the dielectric layer is located between the first gate structure and the second gate structure; and wherein a thickness of the second part of the dielectric layer is smaller than a thickness of the first part of the dielectric layer, and the thickness of the first part of the dielectric layer is smaller than a thickness of the third part of the dielectric layer.

7. The semiconductor structure of claim 6, wherein the dielectric layer further comprises a fourth part;

the fourth part of the dielectric layer is located above the second gate structure and covers a top of the second gate structure; and both a top of the second semiconductor pillar and a top of the third semiconductor pillar are higher than a top of the fourth part of the dielectric layer.

8. The semiconductor structure of claim 1, further comprising:

a first isolation layer, located between adjacent first semiconductor pillars of the first semiconductor pillars, wherein the first gate structure and the second gate structure are located between the first isolation layer and the first semiconductor pillar.

9. A method for manufacturing a semiconductor structure, comprising:

providing a substrate comprising discrete first semiconductor pillars arranged at a top of the substrate and extending in a vertical direction; and second semiconductor pillars and third semiconductor pillars extending in the vertical direction, wherein a second semiconductor pillar of the second semiconductor pillars and a third semiconductor pillar of the third semiconductor pillars are arranged symmetrically at a top of each of the first semiconductor pillars;

forming, in a middle region of a first semiconductor pillar of the first semiconductor pillars, a first gate structure surrounding the first semiconductor pillar; and forming, in a middle region of the second semiconductor pillar and of the third semiconductor pillar, a second gate structure comprising a first ring structure and a second ring structure, the first ring structure surrounding the second semiconductor pillar, and the second ring structure surrounding the third semiconductor pillar;

wherein forming the substrate comprises:

providing an initial substrate, comprising discrete initial semiconductor pillars arranged at a top of the initial substrate and extending in the vertical direction; and forming a groove at a top of the initial semiconductor pillar, wherein the remaining initial semiconductor pillar on both sides of the groove forms the second semiconductor pillar and the third semiconductor pillar, and the remaining initial semiconductor pillar below the groove forms the first semiconductor pillar.

10. The manufacturing method of claim 9, wherein forming the first gate structure comprises:

etching a part of a sidewall of the first semiconductor pillar, so that a width of the middle region of the first semiconductor pillar is smaller than a width of a bottom of the first semiconductor pillar;

forming a first initial dielectric layer on the sidewall of the first semiconductor pillar, wherein a part, located in the middle region of the first semiconductor pillar, of the first initial dielectric layer forms a first part of a dielectric layer, the first part of the dielectric layer being located between the first gate structure and the first semiconductor pillar;

forming a first gate layer around a sidewall of the first initial dielectric layer; and etching the first gate layer to form the first gate structure.

11. The manufacturing method of claim 9, wherein forming the second gate structure comprises:

forming a second initial dielectric layer on a sidewall of the second semiconductor pillar and of the third semiconductor pillar, wherein a part, located in the middle region of the second semiconductor pillar and of the third semiconductor pillar, of the second initial dielectric layer, forms a second part of a dielectric layer, the second part of the dielectric layer being located between the first ring structure and the second semiconductor pillar, and between the second ring structure and the third semiconductor pillar;

forming a second gate layer around a sidewall of the second initial dielectric layer on the second semiconductor pillar and the third semiconductor pillar; and etching the second gate layer to form the first ring structure and the second ring structure, thereby forming the second gate structure.

12. The manufacturing method of claim 11, wherein forming the second initial dielectric layer on the sidewall of the second semiconductor pillar and of the third semiconductor pillar comprises:

performing selective epitaxial growth on the sidewall of the second semiconductor pillar and of the third semiconductor pillar to form an epitaxial layer; and processing the epitaxial layer to form the second initial dielectric layer.

13. A semiconductor structure, comprising:

a substrate, comprising: discrete first semiconductor pillars arranged at a top of the substrate and extending in a vertical direction; and second semiconductor pillars and third semiconductor pillars extending in the vertical direction, wherein a second semiconductor pillar of the second semiconductor pillars and a third semiconductor pillar of the third semiconductor pillars are provided at a top of each of the first semiconductor pillars;

a first gate structure, arranged in a middle region of a first semiconductor pillar of the first semiconductor pillars and surrounding the first semiconductor pillar;

a second gate structure, arranged in a middle region of the second semiconductor pillar and of the third semiconductor pillar, and comprising a first ring structure and a second ring structure, the first ring structure surrounding the second semiconductor pillar, and the second ring structure surrounding the third semiconductor pillar; and wherein a length of the second gate structure in the vertical direction is smaller than a length of the first gate structure in the vertical direction.

14. The semiconductor structure of claim 13, wherein, a groove is formed in a region between the second semiconductor pillar and the third semiconductor pillar at the top of each of the first semiconductor pillars; and the first ring structure and the second ring structure form a shared structure in the groove, the shared structure passing through the groove.

15. The semiconductor structure of claim 14, wherein, both a width of the second semiconductor pillar and a width of the third semiconductor pillar are smaller than a width of the first semiconductor pillar; and a length of the second semiconductor pillar in the vertical direction is equal to a length of the third semiconductor pillar in the vertical direction and both the length of the second semiconductor pillar in the vertical direction and the length of the third semiconductor pillar in the vertical direction are smaller than a length of the first semiconductor pillar in the vertical direction.

16. The semiconductor structure of claim 13, wherein, both a thickness of the first ring structure and a thickness of the second ring structure are greater than a thickness of the first gate structure.

17. The semiconductor structure of claim 14, wherein, an other part of the second gate structure other than the shared structure forms a peripheral structure; and a thickness of the peripheral structure is smaller than a thickness of the shared structure.

18. The semiconductor structure of claim 13, further comprising:

a covering layer comprising a first interconnecting hole, wherein a contact electrode is formed in the first interconnecting hole to electrically connect the second semiconductor pillar and the third semiconductor pillar to a capacitor.

19. The semiconductor structure of claim 13, further comprising:

a first isolation layer, located between adjacent first semiconductor pillars of the first semiconductor pillars, wherein the first gate structure and the second gate structure are located between the first isolation layer and the first semiconductor pillar.

* * * * *